(12) United States Patent
Mori et al.

(10) Patent No.: US 9,751,068 B2
(45) Date of Patent: Sep. 5, 2017

(54) TARGET SUBSTANCE TRANSFER METHOD, CRYSTAL PRODUCTION METHOD, COMPOSITION PRODUCTION METHOD, AND TARGET SUBSTANCE TRANSFER DEVICE

(75) Inventors: Yusuke Mori, Suita (JP); Tsuyoshi Inoue, Suita (JP); Kazufumi Takano, Suita (JP); Hiroyoshi Matsumura, Suita (JP); Hiroaki Adachi, Suita (JP); Shigeru Sugiyama, Suita (JP); Ryota Murai, Suita (JP); Masateru Kurata, Suita (JP); Hiroshi Yoshikawa, Suita (JP); Mihoko Hirao, Suita (JP); Satoshi Nakayama, Suita (JP); Yoshinori Takahashi, Suita (JP); Satoshi Murakami, Machida (JP)

(73) Assignee: Osaka University, Osaka (JP)

( * ) Notice: Subject to any disclaimer, the term of this patent is extended or adjusted under 35 U.S.C. 154(b) by 1068 days.

(21) Appl. No.: 13/980,212

(22) PCT Filed: Jan. 18, 2012

(86) PCT No.: PCT/JP2012/051002
§ 371 (c)(1),
(2), (4) Date: Jul. 17, 2013

(87) PCT Pub. No.: WO2012/099180
PCT Pub. Date: Jul. 26, 2012

(65) Prior Publication Data
US 2013/0299099 A1    Nov. 14, 2013

(30) Foreign Application Priority Data

Jan. 18, 2011 (JP) ................................ 2011-008320

(51) Int. Cl.
*C30B 29/54* (2006.01)
*B01J 19/00* (2006.01)
(Continued)

(52) U.S. Cl.
CPC .......... *B01J 19/008* (2013.01); *B01D 9/0081* (2013.01); *B01J 19/10* (2013.01); *B01J 19/121* (2013.01); *C30B 5/00* (2013.01); *C30B 29/58* (2013.01)

(58) Field of Classification Search
CPC ................................ C30B 29/54; C30B 29/56
See application file for complete search history.

(56) References Cited

U.S. PATENT DOCUMENTS 6,066,229 A   5/2000 Komine et al.
2005/0241568 A1  11/2005 Sasaki et al.
(Continued)

FOREIGN PATENT DOCUMENTS

JP   2-298303   12/1990
JP   11-034057   2/1999
(Continued)

OTHER PUBLICATIONS

Kurata et al., "Improvement of femtosecond laser-induced nucleation technique of protein in a gel solution", Extended Abstracts of the 57th Spring Meeting, 2010, The Japan Society of Applied Physics and the Related Societies, p. 04-304.
(Continued)

*Primary Examiner* — Robert M Kunemund
(74) *Attorney, Agent, or Firm* — Hamre, Schumann, Mueller & Larson, P.C.

(57) ABSTRACT

The present invention provides a target substance transfer method, a crystal production method, a composition production method, and a target substance transfer device, which allow the concentration of a target substance to be
(Continued)

increased easily and effectively. The target substance transfer method is a method for transferring a target substance 103 from a first phase 101 that is a liquid or solid phase containing the target substance 103 to a second phase 102 including: a phase approximation step of bringing the first phase 101 and the second phase 102 into close proximity; and a bubble collapse step of forming bubbles in the vicinity of a boundary between the first phase 101 and the second phase 102 and then causing the bubbles to collapse.

10 Claims, 16 Drawing Sheets

(51) Int. Cl.
*B01D 9/00* (2006.01)
*B01J 19/10* (2006.01)
*B01J 19/12* (2006.01)
*C30B 5/00* (2006.01)
*C30B 29/58* (2006.01)

(56) References Cited

U.S. PATENT DOCUMENTS

| | | |
|---|---|---|
| 2006/0081173 A1 | 4/2006 | Yoshizaki et al. |
| 2006/0111555 A1 | 5/2006 | Hoffmann |
| 2006/0255323 A1 | 11/2006 | Seki et al. |

FOREIGN PATENT DOCUMENTS

| | | |
|---|---|---|
| JP | 2000-256487 | 9/2000 |
| JP | 2005-168495 | 6/2005 |
| JP | 2005-177746 | 7/2005 |
| JP | 2009-096663 | 5/2009 |
| JP | 2009-131737 | 6/2009 |
| WO | 2004/018744 | 3/2004 |
| WO | 2004/106598 | 12/2004 |
| WO | 2006/104048 | 10/2006 |
| WO | 2009/091053 | 7/2009 |

OTHER PUBLICATIONS

Murai et al., "Femtosecond laser-induced nucleation of protein in highly viscous solution", Extended Abstracts of the 56th Spring Meeting, 2009, the Japan Society of Applied Physics and Related Societies, p. 1354.

Zeira et al., "Femtosecond Infrared Laser—An Efficient and Safe in Vivo Gene Delivery System for Prolonged Expression", Molecular Therapy, 2003, vol. 8, No. 2, pp. 342-350.

Ogura et al., "Delivery of Photosensitizer to Cells by the Stress Wave Induced by a Single Nanosecond Laser Pulse", Japan Journal of Applied Physics, 2003, vol. 42, part 2, No. 8A, L977-L979.

Adachi, et al., "Membrane Protein Crystallization Using Laser Irradiation", Japanese Journal of Applied Physics, vol. 43, No. 10B, 2004, pp. L1376-L1378.

Murai, et al., "Enhancement of femtosecond laser-induced nucleation of protein in a gel solution", Applied Physics Letters, vol. 96, 2010, 043702.

Iefuji, et al., "Laser-induced nucleation in protein crystallization: Local increase in protein concentration induced by femtosecond laser irradiation", Journal of Crystal Growth, vol. 318, 2011, pp. 741-744.

Extended European Search Report of the corresponding European patent application (No. 12736266.3) dated Jun. 20, 2017.

Yoshikawa et al., "Femtosecond laser-induced nucleation of protein in agarose gel", Journal of Crystal Growth, 2009, vol. 311, No. 3, pp. 956-959.

TARGET SUBSTANCE TRANSFER METHOD, CRYSTAL PRODUCTION METHOD, COMPOSITION PRODUCTION METHOD, AND TARGET SUBSTANCE TRANSFER DEVICE

TECHNICAL FIELD

The present invention relates to a target substance transfer method, a crystal production method, a composition production method, and a target substance transfer device.

BACKGROUND ART

Clarifying the three-dimensional structure of a biological substance such as a protein or a nucleic acid is very beneficial from an industrial viewpoint. More specifically, for example, it reveals the functions of the biological substance in vivo, thus allowing efficient drug development.

Among various methods for analyzing the three-dimensional structure of a protein, nucleic acid, or the like, for example, crystal structure analysis, especially by X-ray diffraction imaging, is highly effective and has been used widely. To perform analysis by this method, it is necessary to produce crystals of an analyte (a substance to be analyzed), i.e., the protein, nucleic acid, or the like. To this end, there has been used a method for precipitating crystals of (i.e., crystallizing) the analyte out of a solution containing the analyte (Patent Document 1 etc.). However, precipitating crystals of (i.e., crystallizing) a protein, nucleic acid, or the like out of a solution thereof is difficult and requires very advanced techniques. The reason for this is considered to be that, in the solution of the protein, nucleic acid, or the like, crystal nucleus formation does not occur, or even if it does, the formed crystal nuclei disappear right away.

As a method for obtaining crystals of a protein or a nucleic acid more easily, there has been used a method for crystallizing the protein or nucleic acid in a gel, instead of in a solution (Patent Document 2). However, in order to obtain crystals excellent in quality, strength, etc. more easily, further improvement in the techniques has been demanded.

Under these circumstances, there has been an attempt to work on crystallization of a protein by irradiating a solution of the protein with a laser beam to cause formation of crystal nuclei of the protein (Non-Patent Document 1). The principle of this method can be explained as follows. First, when the protein solution is irradiated with a laser beam, a phenomenon (so-called cavitation) occurs in which bubbles are formed and then disappear within a short time. When the formed bubble expands, the protein in the solution is adsorbed onto the surface of the bubble. Then, when the bubble contracts in the course of disappearing, the surface area of the bubble becomes smaller, so that the adsorbed protein is concentrated, resulting in an increased protein concentration (density). It is considered that crystal nuclei are more likely to be formed at this portion where the concentration of the protein is high (the protein is concentrated).

Furthermore, it has been revealed that crystal nucleus formation can be induced more efficiently by irradiating a protein solution with a laser beam after the viscosity of the protein solution has been increased or the protein solution has been turned into a gel (Non-Patent Document 2).

CITATION LIST

Patent Document(s)

Patent Document 1: WO 2004/106598
Patent Document 2: WO 2009/091053

Non-Patent Document(s)

Non-Patent Document 1: H. Adachi et al., Jpn. J. Appl. Phys. 43 (2003) L1376.
Non-Patent Document 2: R. Murai et al., Applied Phys. Lett., 96 (2010) 043702

BRIEF SUMMARY OF THE INVENTION

Problem to be Solved by the Invention

However, since a solution is a fluid, even if cavitation is caused by laser beam irradiation or the like, a target substance (a protein or the like) to be crystallized remains at a high concentration only for a short time. Thus, there is a limit to the increase of the concentration of the target substance for crystal nucleus formation (hereinafter may be referred to simply as "nucleus formation"). On the other hand, in the case of a gel-like substance or the like with low fluidity, even if laser beam irradiation is performed using a laser beam with the same energy, the bubbles to be formed have a smaller size as compared to those formed in a solution, so that a smaller number of target substance molecules are collected on surfaces of the bubbles. In any case, according to conventional techniques, there is a limit to the increase of the concentration of the target substance utilizing cavitation. This problem is not limited to the case where the target substance to be crystallized is a protein, nucleic acid, or the like, but is common to all the substances that can be a target substance to be crystallized. Moreover, this problem is not limited to crystallization but is common to all the techniques in which increasing the concentration of a target substance is necessary.

With the foregoing in mind, it is an object of the present invention to provide a target substance transfer method, a crystal production method, a composition production method, and a target substance transfer device, which allow the concentration of a target substance to be increased easily and effectively.

Means for Solving Problem

In order to achieve the above object, the present invention provides a method for transferring a target substance from a first phase that is a liquid or solid phase containing the target substance to a second phase that is a liquid or solid phase, including: a phase approximation step of bringing the first phase and the second phase into close proximity; and a bubble collapse step of forming a bubble in the vicinity of a boundary between the first phase and the second phase and then causing the bubble to collapse.

The present invention also provides a method for producing a crystal, including: a target substance transfer step of transferring a target substance to be crystallized; and a crystal precipitation step, wherein the target substance transfer step is the step of transferring the target substance from the first phase to the second phase by the target substance transfer method according to the present invention, and the crystal precipitation step is the step of, after the target substance transfer step, precipitating a crystal of the target substance inside the second phase or at an interface.

The present invention also provides a method for producing a composition, including: a target substance transfer step of transferring a target substance, wherein the target substance transfer step is the step of transferring the target substance from a first phase to a second phase by the target substance transfer method according to the present invention, and the composition is a composition containing the target substance in the second phase.

The present invention also provides a device for transferring a target substance from a first phase that is a liquid or solid phase containing the target substance to a second phase that is a liquid or solid phase, including: a phase approximation unit that brings the first phase and the second phase into close proximity; and a bubble collapse unit that forms a bubble in the vicinity of a boundary between the first phase and the second phase and then causes the bubble to collapse.

Effects of the Invention

According to the present invention, it is possible to provide a target substance transfer method, a crystal production method, a composition production method, and a target substance transfer device, which allow the concentration of a target substance to be increased easily and effectively.

BRIEF DESCRIPTION OF DRAWINGS

FIG. 6 shows an example of the change in lysozyme concentration with time around the bubble when the lysozyme solution single-phase system was irradiated with the laser beam.

In FIG. 9, photographs in the upper row show the results obtained in the absence of the interface, and photographs in the lower row show the results obtained in the presence of the interface.

MODE FOR CARRYING OUT THE INVENTION

Figure 1:
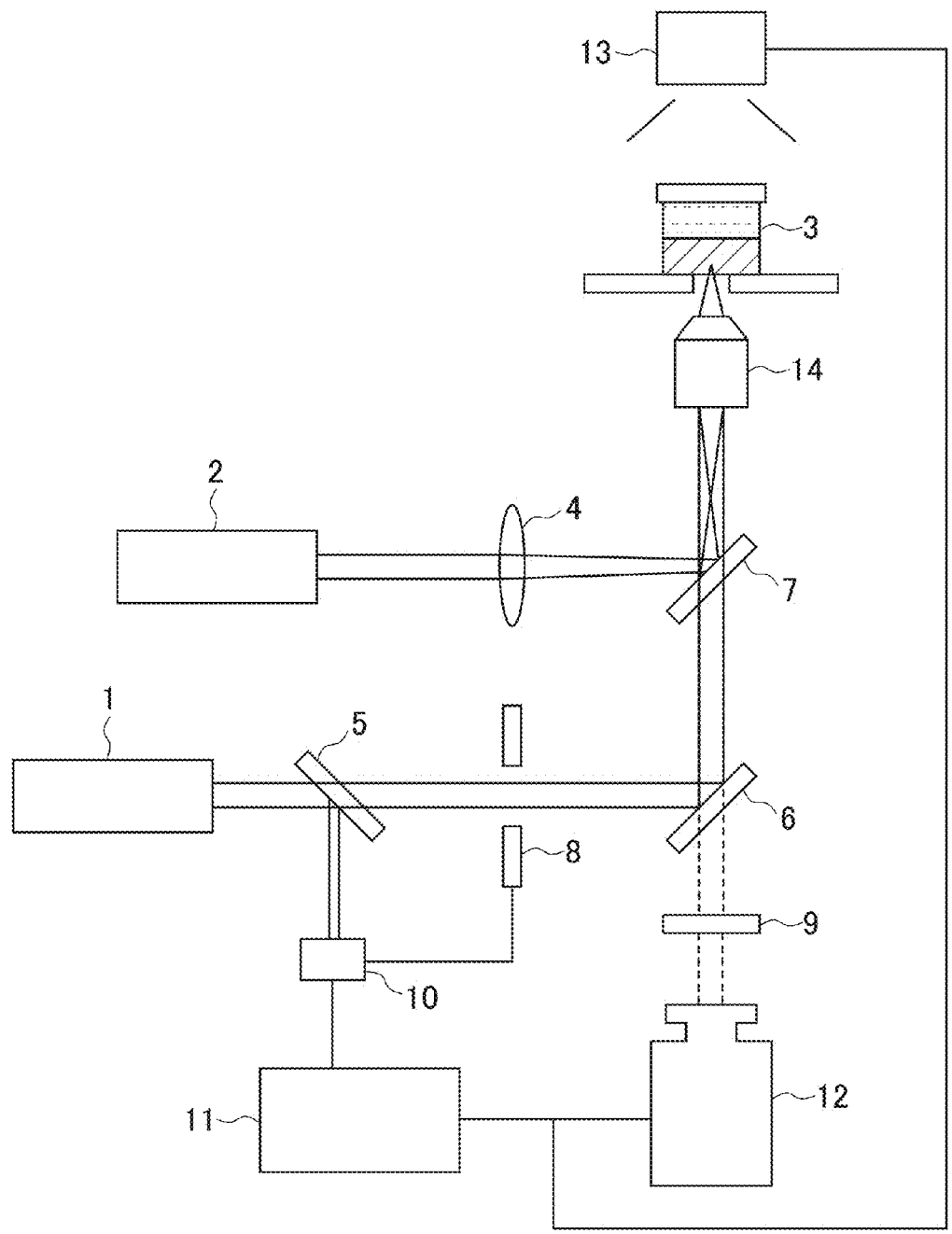
FIG. 1 is a schematic view showing an example of the target substance transfer device according to the present invention.

Next, the present invention will be described with reference to illustrative examples. It is to be noted, however, that the present invention is by no means limited to the following examples.

<Target Substance Transfer Method>

The target substance transfer method according to the present invention is, as described above, a method for transferring a target substance from a first phase that is a liquid or solid phase containing the target substance to a second phase that is a liquid or solid phase, including: a phase approximation step of bringing the first phase and the second phase into close proximity; and a bubble collapse step of forming a bubble in the vicinity of a boundary between the first phase and the second phase and then causing the bubble to collapse. A portion where the bubble is formed is not particularly limited as long as it is in the vicinity of the boundary between the first phase and the second phase. The bubble may be formed in either the first phase or the second phase, but preferably is formed in the first phase, for example.

The target substance is not particularly limited. Preferably, the target substance is an organic substance. More preferably, the target substance is at least one selected from the group consisting of proteins, native proteins, artificial proteins, peptides, native peptides, artificial peptides, nucleic acids, native nucleic acids, artificial nucleic acids, lipids, native lipids, artificial lipids, carbohydrate chains, native carbohydrate chains, artificial carbohydrate chains, high molecular weight organic compounds, low molecular weight organic compounds, biological substances, high molecular weight biological compounds, and low molecular weight biological compounds. Only one kind of target substance may be used, or two or more kinds of target substances may be used in combination.

In the present invention, the biological substances are not particularly limited, and examples thereof include high molecular weight biological compounds, low molecular weight biological compounds, proteins, native proteins, artificial proteins, peptides, native peptides, artificial peptides, nucleic acids, native nucleic acids, artificial nucleic acids, lipids, native lipids, artificial lipids, carbohydrate chains, native carbohydrate chains, and artificial carbohydrate chains. Only one kind of biological substance may be used, or two or more kinds of biological substances may be used in combination. In the present invention, "biological substances", "high molecular weight biological compounds", and "low molecular weight biological compounds" may be substances derived from living organisms, or may be synthetic substances having the same structures as these substances. Alternatively, they also may be derivatives or artificial substances having similar structures to the substances derived from living organisms. For example, when the biological substance is a high molecular weight biological compound, it may be a high molecular weight compound derived from a living organism; a high molecular weight synthetic biological compound having the same structure as the high molecular weight compound derived from a living organism; or a derivative or a high molecular weight artificial compound having a similar structure to the high molecular weight compound derived from a living organism. When the biological substance is a low molecular weight biological compound, it may be a low molecular weight compound derived from a living organism; a low molecular weight synthetic biological compound having the same structure as the low molecular weight compound derived from a living organism; or a derivative or a low molecular weight artificial compound having a similar structure to the low molecular weight compound derived from a living organism. When the biological substance is a protein, it may be a protein derived from a living organism (a naturally-derived protein); a synthesized protein; a native protein having a naturally-occurring structure; or an artificial protein having a structure that does not exist in nature. When the biological substance is a peptide, it may be a peptide derived from a living organism (a naturally-derived peptide); a synthesized peptide; a native peptide having a naturally-occurring structure; or an artificial peptide having a structure that does not exist in nature. When the biological substance is a nucleic acid, it may be a nucleic acid derived from a living organism (a naturally-derived nucleic acid); a synthesized nucleic acid; a native nucleic acid having a naturally-occurring structure; or an artificial nucleic acid having a structure that does not exist in nature. When the biological substance is a lipid, it may be a lipid derived from a living organism (a naturally-derived lipid); a synthesized lipid; a native lipid having a naturally-occurring structure; or an artificial lipid having a structure that does not exist in nature. When the biological substance is a carbohydrate chain, it may be: a carbohydrate chain derived from a living organism (a naturally-derived carbohydrate chain); a synthesized carbohydrate chain; a native carbohydrate chain having a naturally-occurring structure; and an artificial carbohydrate chain having a structure that does not exist in nature. The native nucleic acid is not particularly limited, and examples thereof include DNA and RNA. The artificial nucleic acid is not particularly limited, and examples thereof include LNA and PNA.

In the present invention, the molecular weight of the organic substance is not particularly limited. For example, organic substances having a molecular weight of 1000 or more may be referred to as "high molecular weight organic compounds", and organic substances having a molecular weight of less than 1000 may be referred to as "low molecular weight organic compounds", but the definitions of the high and low molecular weight organic compounds are not limited thereto. Similarly, biological substances having a molecular weight of 5000 or more may be referred to as "high molecular weight biological compounds", and biological substances having a molecular weight of less than 5000 may be referred to as "low molecular weight biological compounds", but the definitions of the high and low molecular weight biological substances are not limited thereto. When the biological substance is a peptide, the molecular weight thereof may be 300 or more, for example.

As described above, the first phase is a liquid or solid phase containing the target substance. The liquid phase is not particularly limited, and may be a solution or a dispersion (e.g., emulsion, suspension, or the like) of the target substance, for example. The solid phase also is not particularly limited, for example, and may be: a gel or the like; a solution, dispersion (e.g., emulsion, suspension, or the like), or the like of the target substance in a solidified form; or a solid impregnated with the target substance. For example, it is preferable that the first phase is a liquid phase as in the examples to be described below, because it allows the target substance to be transferred to the second phase more easily. The distinction between a solid phase (solid) and a liquid phase (liquid) may not necessarily be clear. For example, in some cases, an amorphous solid (amorphous) may be considered to be a liquid with a high viscosity. Furthermore, for example, a gel generally refers to a sol that has turned into a solid, but it also may refer to a sol that has turned into a liquid with a high viscosity. Hereinafter, in the first phase, a liquid or solid in which the target substance is dissolved, suspended, or dispersed, for example, also may be referred to simply as a "medium". In the first phase, the liquid or solid phase may or may not contain a substance(s) other than the above-described target substance and medium as appropriate. For example, as will be described below, the first phase may be a solution containing a protein and a precipitating agent.

In the first phase, the medium for the target substance is not particularly limited, and may be selected as appropriate depending on the kind of the target substance, the composition of the second phase, etc. Only one kind of medium may be used, or two or more kinds of media may be used in combination. The concentration of the target substance also is not particularly limited, and may be set as appropriate depending on the purpose of performing the target substance transfer method of the present invention, etc. For example, when the first phase is a solution, the solution may be saturated, unsaturated, or supersaturated. The concentration of the target substance in the solution is, for example, 0.5- to 20.0-fold, preferably 0.8- to 10.0-fold, and more preferably 1.0- to 5.0-fold higher than the saturated concentration.

The second phase is not particularly limited as long as it can be distinguished from the first phase by a physical boundary. The physical boundary preferably is an interface between the first phase and the second phase. That is to say, it is preferable that the first phase and the second phase are in contact with each other to form an interface therebetween, from the viewpoint of ease of transferring the target substance, for example. The first phase and the second phase may form an interface therebetween owing to their properties of not mixing with each other, for example. For example, at least one of the first phase and the second phase may be a solid phase. Also, for example, the first phase and the second phase may be such that: the first phase is an aqueous phase while the second phase is an oil phase; or conversely, the first phase is an oil phase while the second phase is an aqueous phase. Furthermore, for example, the first phase and the second phase may be separated from each other with a membrane (e.g., a reverse osmosis membrane) or any other phase (a solid phase, a liquid phase, or a gas phase) being present at their interface.

The second phase may be either a solid phase (solid) or a liquid phase (liquid). As described above in connection with the first phase, the distinction between a solid phase (solid) and a liquid phase (liquid) may not necessarily be clear, and, for example, in some cases, an amorphous solid (amorphous) may be considered to be a liquid with a high viscosity. Furthermore, for example, a gel generally refers to a sol that has turned into a solid, but it also may refer to a sol that has turned into a liquid with a high viscosity. The second phase may be, for example, a solid phase, a gel, a liquid phase, an oil phase, an aqueous phase, or a protein membrane. When the second phase is a liquid phase, for example, it may be a liquid in which a target substance exhibits a high solubility, or may be an inactive liquid such as Fluorinert (the trade name of a fluorine compound commercially available from 3M Co.). According to the target substance transfer method of the present invention, for example, it is possible to transfer the target substance to the second phase even in the case where the second phase is a phase in which it is usually difficult to dissolve the target substance. Utilizing this advantageous effect, the target substance transfer method of the present invention can be applied to the crystal production method, the composition production method, etc. according to the present invention to be described below, for example. The second phase to which it is difficult to transfer the target substance is not particularly limited, and may be, for example: an inactive liquid; an oil phase for a water-soluble target substance; an aqueous phase for a water-insoluble target substance; or a solid phase into which the target substance poorly penetrates according to ordinary methods.

When the first phase or the second phase is a solid phase, the hardness thereof is not particularly limited. The hardness of the solid phase can be represented as a compressive strength, for example. The lower limit of the compressive strength when the first phase and second phase are solid phases is not particularly limited, and is, for example, a value more than 0 or a value more than a lower measurement limit of a measuring instrument. Also, when the first phase is a solid phase, it is preferable that the solid phase is not too hard, for example, from the viewpoint of ease of forming and collapsing bubbles in the bubble collapse step, or from the viewpoint of ease of transferring the target substance to the second phase. The upper limit of the compressive strength of the first phase preferably is 1000 Pa or less, more preferably 800 Pa or less, still more preferably 600 Pa or less, and particularly preferably 400 Pa or less. When the second phase is a solid phase, it is preferable that the solid phase is not too hard, from the viewpoint of ease of transferring the target substance to the second phase. The upper limit of the compressive strength of the second phase preferably is 3000 Pa or less, more preferably 2000 Pa or less, still more preferably 1500 Pa or less, and particularly preferably 1000 Pa or less. The compressive strength is a numerical value measured using a RheoStress RS1 Rheometer (the trade name of a rheometer manufactured by EKO INSTRUMENTS Co., Ltd.) in a dynamic viscoelastic measurement mode at a frequency of 1 Hz and a measurement temperature of 20° C. The measured values shown in FIG. 22 and FIG. 23 also were measured by this method. It is to be noted, however, that this measurement method merely is an example of the method for measuring the compressive strength, and the present invention is by no means limited by the steps and conditions in this measurement method. Even when a different rheometer is used, the same measured value of compressive strength can be obtained, in the absence of error, when the rheometer is used in the same measurement mode and at the same measurement temperature and frequency. When the solid phase is a gel, the compressive strength is referred to as the "gel strength". In the case where the solid phase has a melting temperature (when the solid phase is a gel, a gel melting temperature) lower than 20° C. so that the solid phase is not in a solid state (a gel state when the solid phase is a gel) at 20° C., the compressive strength is set to a measured value measured at, among Celsius temperatures that are lower than the melting temperature and divisible by 5 (e.g., 15° C., 10° C., 5° C., 0° C., and −5° C.), the highest temperature allowing the measurement. Furthermore, for example, in the case where the solid phase is a thermoreversible gel that has a gel melting temperature of higher than 20° C. and thus is not in a gel state at 20° C. (it is in a sol state instead), the compressive strength (the gel strength) is set to a measured value measured at, among Celsius temperatures that are higher than the gel melting temperature and divisible by 5 (e.g., 25° C., 30° C., 35° C.), the lowest temperature allowing the measurement.

In the phase approximation step, the shortest distance between the first phase and the second phase preferably is not more than 4 times a maximum radius of the bubble, more preferably not more than twice a maximum radius of the bubble. This is because the target substance can be transferred from the first phase to the second phase more easily in the bubble collapse step, if the distance between the first phase and the second phase is not more than the above value. The maximum radius of the bubble can be measured using, for example, a high-speed camera (also may be referred to as a fast camera or a CCD camera), as in the examples to be described below. The shortest distance between the first phase and the second phase may be 5000 μm or less, preferably 3000 μm or less, and more preferably 1000 μm or less, for example, although it varies depending on the maximum radius of the bubble. The phase approximation step preferably is the step of bringing the first phase and the second phase into contact with each other to form an interface therebetween. That is, as described above, it is more preferable that the first phase and the second phase are in contact with each other to form an interface therebetween from the viewpoint of ease of transferring the target substance, for example. In this case, it is still more preferable that the bubble collapse step is a bubble collision step of forming bubbles in the vicinity of the interface to allow the bubbles to collide against the interface, from the viewpoint of ease of transferring the target substance. In the bubble collision step, the bubbles may be formed in either the first phase or the second phase, but preferably are formed in the first phase.

In the bubble collapse step, the method for forming bubbles is not particularly limited, and it preferably is achieved by, in either the first phase or the second phase, irradiating a portion in the vicinity of the boundary with the other phase (when the first phase and the second phase are in contact with each other to form an interface therebetween, in the vicinity of the interface) with at least one of a laser beam and an ultrasonic wave. For example, by focusing a laser beam in the vicinity of the boundary with the other phase in the first phase or the second phase under appropriate conditions, it is also possible to form bubbles at or around the focal point. The irradiation intensity, the focal point, etc. of a laser beam can be controlled easily, so that conditions appropriate for the transfer of a target substance can be set more easily. On the other hand, ultrasonic irradiation can be carried out at low cost. The total irradiation energy of the laser beam and/or the ultrasonic wave is not particularly limited, and is, for example, at least 60 nJ, preferably at least 100 nJ, and more preferably at least 200 nJ. The upper limit of the total irradiation energy is not particularly limited, and is not more than 10 J, for example.

Figure 9:
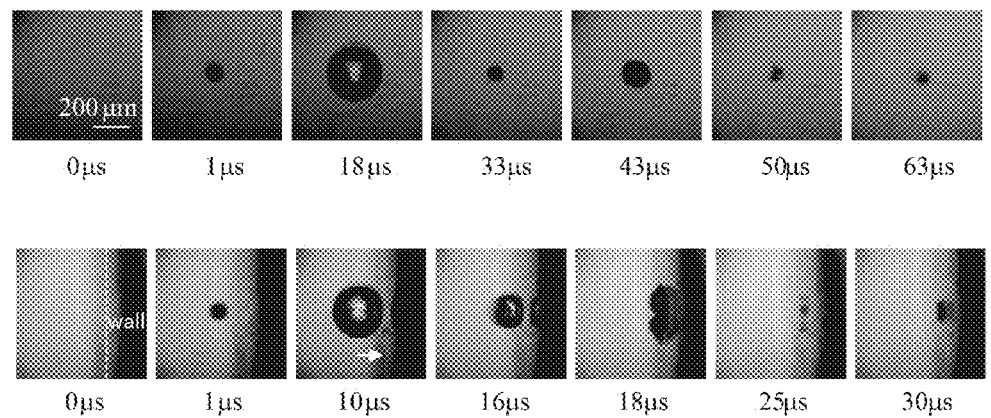
FIG. 9 shows photographs showing an example of how a bubble changed with time in the presence and absence of an interface in the vicinity of a portion where cavitation occurred.

In the bubble collapse step, the method for collapsing the bubbles is not particularly limited. For example, instead of using any special system for collapsing bubbles, the bubbles may be caused to collapse by cavitation behavior exhibited by the bubbles. Also, in the above-described bubble collision step, the method for causing the bubbles to collide against the interface is not particularly limited. For example, by applying a pressure or the like to the first phase or the second phase using any appropriate means, the bubbles may be caused to move toward the interface to collide against the interface. Alternatively, the bubbles may be caused to collide against the interface by cavitation behavior exhibited by the bubbles. In this case, for example, as in the examples to be described below, without using any special means for causing the bubbles to collide against the interface, the bubbles may automatically collide against the interface by the cavitation behavior. FIG. 9 shows an example of the cavitation behavior. FIG. 9 illustrates cavitation behavior caused by focusing a laser beam in ultrapure water in a glass cell, and photographs shown in FIG. 9 were taken with a high-speed camera (also may be referred to as a fast camera or a CCD camera). The photographs in the upper row of FIG. 9 show the cavitation behavior, i.e., how a bubble changed with time when the laser beam was focused on (for irradiation) a position apart from a wall surface of the container. The photographs in the lower row of FIG. 9 show the cavitation behavior, i.e., how a bubble changed with time when the laser beam was focused in the vicinity of the wall surface of the container. In either case, the bubbles were formed at the focal position of the laser beam or in the vicinity thereof. In FIG. 9, "µs" indicates the time (microsecond) elapsed after the start of the laser beam irradiation. As can be seen from FIG. 9, the bubble formed at the position apart from the wall surface disappeared without coming into contact with the wall surface. In contrast, the bubble formed by the laser beam irradiation in the vicinity of the wall surface of the container was accelerated as if it was drawn to the wall and then disappeared by colliding against the wall. The inventors of the present invention discovered the above-described phenomenon, thereby achieving the present invention. For example, by accelerating molecules of the target substance adsorbed on the surfaces of the bubbles toward the interface with the second phase and introducing them into the second phase utilizing the cavitation behavior shown in the lower row of FIG. 9, it is possible to achieve a high target substance concentration that usually cannot be achieved in the second phase. For example, as will be described below, this can promote crystal nucleus formation in the second phase, and also, this allows the production of a protein chip or the like in which the protein is highly concentrated in a gel. It is to be noted, however, that this mechanism is merely illustrative, and does not limit the present invention by any means.

Figure 10:
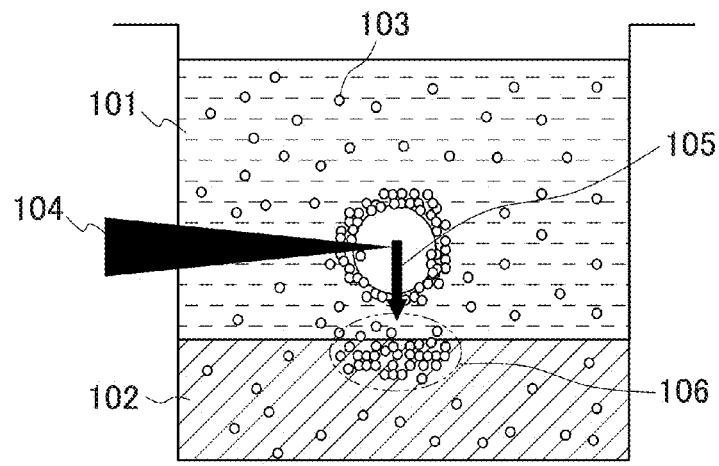
FIG. 10 is a sectional view schematically showing one example of the mechanism used in the target substance transfer method of the present invention.

The target substance transfer method utilizing the mechanism (cavitation behavior) shown in FIG. 9 can be illustrated schematically as shown in the sectional view of FIG. 10, for example. In FIG. 10, reference numeral 101 denotes a first phase (e.g., a solution) containing a target substance, and reference numeral 102 denotes a second phase (e.g., a gel). Reference numeral 103 denotes particles (e.g., molecules) of the target substance. When a laser beam 104 is focused in the first phase 101, a bubble is formed at or around the focal point. The bubble moves in the direction indicated with the arrow 105 and collides against the interface with the second phase 102. As a result, in the second phase 102, a region where the concentration of the target substance is high is formed in the vicinity of a collision position 106. Reference numeral 104 is not limited to the laser beam, and may be any other stimulation such as an ultrasonic wave, for example. As can be seen from FIG. 10, it is considered that, according to this mechanism, a high concentration region of the target substance (e.g., a protein) is formed in a localized manner immediately below the portion where the bubble was formed, so that the target substance can be introduced intensively to a specific site of the second phase 102. Introduction of a target substance to a specific site as described above is a technique based on a totally new concept in the field of crystal nucleus formation. For example, like ion implantation to a semiconductor, this technique can realize a high concentration that cannot be realized in an equilibrium state. Accordingly, as described above, this technique not only promotes the crystal nucleus formation but also is beneficial in other technical fields.

Even when the bubbles do not collide against the interface, it is possible to transfer the target substance in the first phase to the second phase as long as the bubbles collapse. However, as described above, it is preferable to cause the bubbles to collide against the interface because it allows the target substance to be transferred to the second phase still more easily.

In the bubble collapse step, when the bubbles are formed by focusing a laser beam in the vicinity of the boundary between the first phase and the second phase, it is preferable that the distance from the focal point of the laser beam to the surface of the second phase on the first phase side (in the case where the first phase and the second phase are in contact with each other to form an interface therebetween, the distance from the focal point to the interface) is not more than 4 times a maximum radius of the bubble, from the viewpoint of ease of transferring the target substance to the second phase. It is more preferable that the distance from the focal point of the laser to the surface of the second phase on the first phase side is twice a maximum radius of the bubble. It is particularly preferable that the first phase and the second phase are in contact with each other to form an interface therebetween and the distance from the focal point of the laser beam to the interface is not more than twice a maximum radius of the bubble. When this condition is satisfied, the bubbles are more liable to collide against the interface by cavitation behavior, so that the target substance can be transferred to the second phase still more easily.

In the target substance transfer method of the present invention, the mechanism by which the target substance in the first phase is transferred to the second phase is not necessarily clear. When the second phase is a gel, it is speculated that the mechanism is as follows, for example. First, when the bubbles collapse in the first phase or in the gel (the second phase) in the bubble collapse step (in particular, when the bubbles collide against the interface in the bubble collision step), a flow of the substance in the first phase toward the gel (the second phase) is generated. At this time, a force is applied to the gel (the second phase), so that the gel is deformed. Thus, at a portion where the force was applied, the mesh size of the gel (the size of each opening in the molecular network) becomes greater, and the molecules of the target substance in the first phase move into the gel through the thus-enlarged openings of the network. Thereafter, for example, the mesh size of the gel returns to the original size, thus preventing the target substance in the gel from returning to the first phase. Thus, it is speculated that the gel strength preferably is not too high from the viewpoint of susceptibility of the gel to deformation, as described above. It is to be noted, however, that this description merely is directed to an illustrative example of a presumable mechanism, and does not limit the present invention by any means.

<Crystal Production Method>

The crystal production method of the present invention is, as described above, a method for producing a crystal, including: a target substance transfer step of transferring a target substance to be crystallized; and a crystal precipitation step, wherein the target substance transfer step is the step of transferring the target substance from the first phase to the second phase by the target substance transfer method according to the present invention, and the crystal precipitation step is the step of, after the target substance transfer step, precipitating a crystal of the target substance inside the second phase or at an interface.

Although the following description is directed mainly to crystallization (crystal production method) of a biological substance such as a protein or a nucleic acid in a gel, the crystal production method of the present invention is not limited thereto. For example, the target substance may be a low molecular weight organic compound or any other substance. The first phase and the second phase also are not particularly limited, and may be any phases. The following description is directed mainly to the case where, in the bubble collapse step, bubbles are formed in the first phase (e.g., a protein solution). However, the present invention is not limited thereto. For example, in the bubble collapse step, bubbles may be formed in the second phase. They are specifically as described above in connection with the target substance transfer method of the present invention, for example.

While the first phase may be a solid phase (e.g., a gel or the like), it is preferable that the first phase is a liquid phase. The following description is directed mainly to the case where the first phase is a liquid phase. In the case where the first phase is a solid phase, for example, it may be obtained by adding the same gelling agent used in a second phase to be described below to the following liquid phase. A medium (a solvent or the like) in the first phase is not particularly limited. Specific examples of the medium include water, ethanol, methanol, acetonitrile, acetone, anisole, isopropanol, ethyl acetate, butyl acetate, chloroform, cyclohexane, diethylamine, dimethylacetamide, dimethylformamide, toluene, butanol, butyl methyl ether, hexane, benzene, methyl ethyl ketone, dichloroethane, isobutyl alcohol, isopropyl alcohol, isopropyl acetate, dioxane, dichloroethane, tetrahydrofuran, and methyl isobutyl ketone. Only one kind of medium may be used, or two or more kinds of media may be used in combination. When the target substance is soluble in water, for example, it is preferable to use water or a mixed solvent containing water in terms of ease of operation. The concentration of the target substance is not particularly limited. When the target substance is a biological substance such as a protein or a nucleic acid, the concentration thereof is, for example, 0.5 to 200 mg/mL, preferably 1.0 to 100 mg/mL, and more preferably 2.0 to 50 mg/mL. When necessary, a pH adjuster, a precipitating agent to be described below, etc. may be added as appropriate.

As described above, the second phase may be any phase. In particular, when crystals of a biological substance such as a protein or a nucleic acid are produced, the second phase preferably is a gel, for example. Crystal production in a gel is advantageous in that, for example: crystals with excellent strength and quality can be obtained easily; and the obtained crystals are covered with the gel so that they are resistant to destruction. This is particularly advantageous when a brittle and fragile crystal of a protein, a nucleic acid, or the like is used for X-ray crystal structure analysis or the like, for example. Furthermore, when the second phase is a gel, for example, crystals are precipitated more easily as compared to the case where the second phase is a solution. The reason for this is not necessarily clear, but is speculated to be as follows, for example. That is, when the second phase is a gel, diffusion of the target substance in the second phase is suppressed, so that, in a portion of the second phase to which the target substance has been transferred, the concentration of the target substance is more likely to be increased in a localized manner. It is to be noted, however, that this explanation merely is directed to an illustrative example of a presumable mechanism, and does not limit the present invention by any means.

When the second phase is gel, the gel can be produced by dissolving a gelling agent in a solvent and then solidifying (causing gelation of) the mixture, for example. The solvent is not particularly limited, and examples thereof include water, ethanol, methanol, acetonitrile, acetone, anisole, isopropanol, ethyl acetate, butyl acetate, chloroform, cyclohexane, diethylamine, dimethylacetamide, dimethylformamide, toluene, butanol, butyl methyl ether, hexane, benzene, and methyl ethyl ketone. Only one kind of solvent may be used, or two or more kinds of solvents may be used in combination.

The gelling agent is not particularly limited. For example, the gelling agent preferably is at least one selected from the group consisting of polysaccharides, polysaccharide thickeners, proteins, and high-temperature gelation type gels. More preferably, the gelling agent is at least one selected from the group consisting of agarose, agar, carrageenan, gelatin, collagen, polyacrylamide, high-temperature gelation type polyacrylamide gel. The gelation temperature is not particularly limited, and is, for example, 0° C. to 90° C., preferably 0° C. to 60° C., and more preferably from 0° C. to 35° C., from the viewpoint of ease of performing the crystal production.

The gelling agent may be, for example, a gel that turns into a gel at low temperature and turns into a sol at high temperature, or conversely, a gel that turns into a sol at low temperature and turns into a gel at high temperature. The gel that turns into a gel at low temperature and turns into a sol at high temperature is referred to as a "high-temperature gelation type gel". Furthermore, for example, the gelling agent preferably is a gel that turns back to a sol when the gel obtained by cooling is heated again or the gel obtained by heating is cooled again. Such a gelling agent is referred to as a "thermoreversible gel". The gelling agent may be either a hydrogel or an organogel, for example, and preferably is a hydrogel. As a hydrogel, for example, it is more preferable to use a high-temperature gelation type hydrogel. In contrast to common gels that turn into gels at low temperature and turn into sols at high temperature, the high-temperature gelation type hydrogel has a property of turning into a sol at low temperature and turning into a gel at high temperature as described above. Thus, covered crystals covered with the high-temperature gelation type hydrogel are advantageous in that, for example: it is particularly resistant to drying; and removal of the gel can be achieved easily by cooling the gel. The high-temperature gelation type hydrogel is not particularly limited, and may be, for example, Mebiol Gel. Mebiol Gel is the trade name of a high-temperature gelation type hydrogel commercially available from Mebiol Inc. Mebiol Gel has the following chemical structure, for example. Mebiol Gel is a polyacrylamide gel that has properties of a high-temperature gelation type hydrogel as well as properties of a thermoreversible hydrogel.

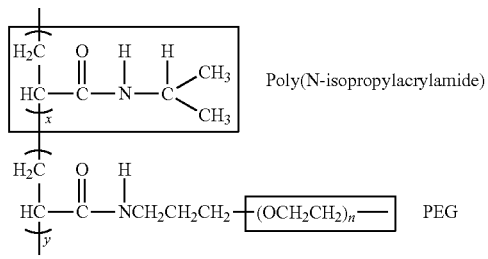

The second phase may or may not contain the target substance. When the second phase contains the target substance, the second phase containing the target substance may be produced first, and then, the second phase may be brought into contact with the first phase to form an interface, for example. Alternatively, the second phase not containing the target substance may be produced first, then the second phase may be brought into contact with the first phase to form an interface, and thereafter, the target substance in the first phase may be transferred to the second phase by allowing the first phase and the second phase to stand for a while, for example. More specifically, for example, a solution containing a target substance (a first phase) may be brought into contact with a gel (a second phase) to transfer the target substance into the gel. For example, the first phase and the second phase preferably are allowed to stand until the concentrations of the target substance in the first phase and the second phase reach equilibrium. When the first phase and the second phase both contain the target substance and the bubble collision step is performed after an interface has been formed between the first phase and the second phase as described above, a high target substance concentration that usually cannot be achieved in the second phase can be realized more easily, for example.

When the second phase is a gel containing the target substance, the second phase can be prepared by adding a gelling agent to the target substance solution, thus turning the target substance solution to a gel, for example. The gelling agent may be added directly to the target substance solution. Preferably, a gelling agent solution is prepared separately and then mixed with the target substance solution, because it allows the gelling agent to be mixed uniformly in the target substance solution more easily. The solvent of the gelling agent solution is not particularly limited, and may be the same as the solvent of the target substance solution, for example. The concentration of the gelling agent in the gelling agent solution is not particularly limited. From the viewpoint of the gel strength etc. to be described below, the concentration of the gelling agent with respect to the total mass of the gelling agent solution is, for example, 0.1 to 50 mass %, preferably 0.1 to 30 mass %, more preferably 0.1 to 20 mass %, still more preferably 0.2 to 15 mass %, and particularly preferably 0.2 to 10 mass %. The method for turning the target substance solution containing the gelling agent to a gel is not particularly limited. For example, gelation may be achieved by preparing the gelling agent solution at a temperature (e.g., 20° C. to 45° C.) higher than the gelation temperature, mixing the gelling agent solution with the target substance solution, and then allowing the thus-obtained mixture to stand at a temperature equal to or lower than the gelation temperature. More specifically, for example, after mixing the gelling agent solution with the target substance solution, the mixture may be enclosed in a capillary tube, wherein the mixture may be turned to a gel. This allows the gel to be enclosed in the capillary tube. Furthermore, in the case where the gel is a thermoreversible hydrogel, for example, in contrast to the above procedure, gelation may be achieved by preparing the gelling agent solution at a low temperature, mixing the gelling agent solution with the target substance solution, and then turning the mixture to a gel by raising the temperature.

The gel strength after the gelation is, for example, 5 Pa or more, preferably 10 Pa or more, more preferably 30 Pa or more, still more preferably 50 Pa or more, and particularly preferably 100 Pa or more, from the viewpoint of ease of protecting crystals of the target substance precipitated in a crystal precipitation step to be described below from physical shock, for example. Also, as described above, the gel strength after the gelation preferably is not too high from the viewpoint of ease of transferring the target substance to a gel. The upper limit of the gel strength after the gelation is as described above as the upper limit of the compressive strength of the second phase in the description regarding the target substance transfer method of the present invention, for example.

The gel strength after the gelation can be set as appropriate by adjusting the concentration of the gelling agent. The gel strength varies depending on the kind of the gelling agent, with the concentrations of gelling agents being equal. For example, as can be seen from the graph of FIG. 22, when agarose III, agarose SP (agarose Sea Plaque), and agarose 9A (they are all trade names of products manufactured by Takara Bio Inc.) are present at the same concentrations, the gel strengths thereof after gelation generally are as follows: agarose III>agarose SP>agarose 9A. The graph of FIG. 23 shows the measurement result obtained regarding only the agarose 9A among the respective agaroses shown in FIG. 22.

Figure 22:
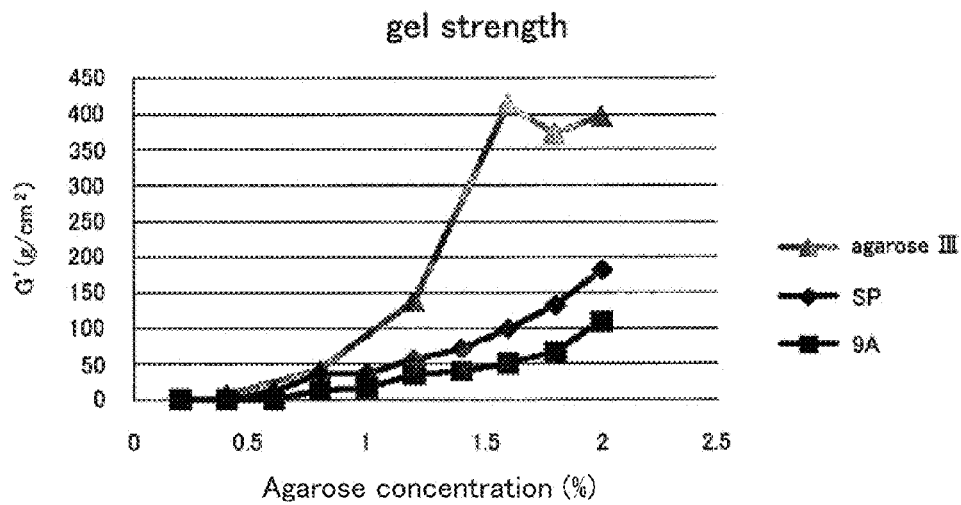
FIG. 22 is a graph showing an example of the result of measuring the gel strength of agarose gels.
Figure 23:
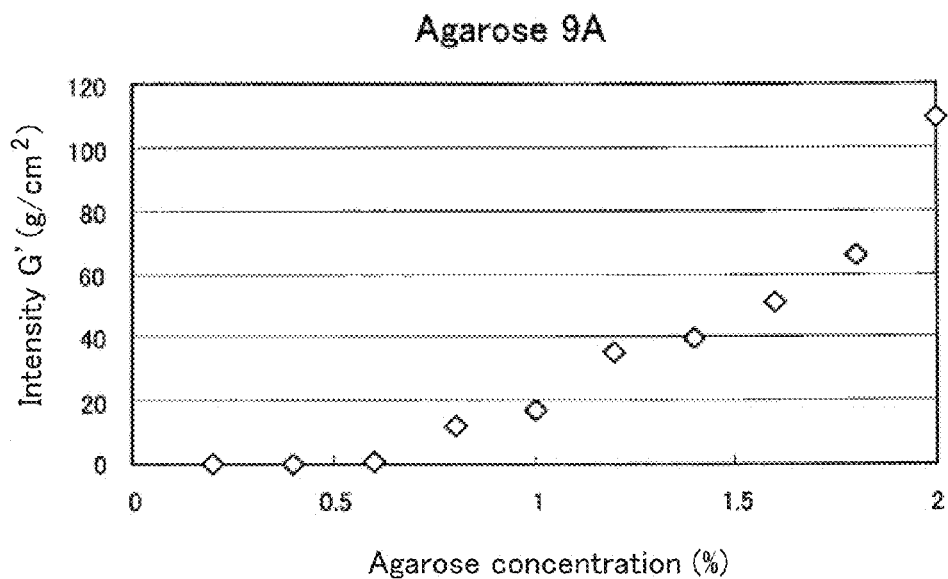
FIG. 23 is a graph plotting part of the data shown in the graph of FIG. 22.

In each of FIGS. 22 and 23, the horizontal axis indicates the concentration (mass %) of each agarose, and the vertical axis indicates the gel strength (g/cm$^2$). 1 g/cm$^2$ corresponds to 98.0665 Pa. When the concentration of the gelling agent is lower than a certain critical concentration, a solution containing the gelling agent does not turn into a gel distinctively, so that the gel strength is unmeasurable (indicated as "0" in the graph). However, when the concentration of the gelling agent is not lower than the critical concentration, the solution can turn into a gel distinctively, so that the gel strength is measurable. In the present invention, the concentration of the gelling agent preferably set to not lower than the critical concentration. The critical concentrations of the agarose III, agarose SP, and agarose 9A are all about 0.6 mass %, as shown in FIGS. 22 and 23.

When the gel (the second phase) does not contain a target substance, the gel can be prepared in the same manner as in the above, except that the target substance is not added (e.g., by dissolving only a gelling agent in a solvent). For example, as in the examples to be described below, the gel (the second phase) not containing a target substance may be brought into contact with a solution (the first phase) containing the target substance, and the gel and the solution may be allowed to stand to cause the gel to be impregnated with the target substance, after which the bubble collision step may be performed. The time period for which the first phase and the second phase are in contact with each other for this purpose is not particularly limited, and is, for example, 0 to 240 h, preferably 0 to 72 h, and more preferably 0 to 24 h. For example, the bubble collision step may be performed after allowing the first phase and the second phase to be in contact with each other until the concentrations of the target substance in these phases reach equilibrium.

In order to allow crystals of the target substance to precipitate out of the gel more easily, a precipitating agent may be used, for example. This method is particularly effective when the target substance is a substance less liable to be crystallized (e.g., a protein, a nucleic acid, or the like). The method for using the precipitating agent is not particularly limited. For example, as in the examples to be described below, the precipitating agent may be contained in the second phase. The precipitating agent is not particularly limited, and for example, those used in known crystal production methods also are applicable in the present invention. The precipitating agent may be, for example, at least one selected from the group consisting of sodium chloride, calcium chloride, sodium acetate, ammonium acetate, ammonium phosphate, ammonium sulfate, potassium sodium tartrate, sodium citrate, PEG (polyethylene glycol), magnesium chloride, sodium cacodylate, HEPES (2-[4-(2-hydroxyethyl)-1-piperazinyl]ethanesulfonic acid), MPD (2-methyl-2,4-pentanediol), and Tris-HCl (Tris(hydroxymethyl)aminomethane hydrochloride). When the precipitating agent is contained in the first phase, the concentration of the precipitating agent is not particularly limited, and is, for example, 0.0001 to 10 M, preferably 0.0005 to 8 M, and more preferably 0.0005 to 6 M. The precipitating agent may contain a pH adjuster etc. as appropriate, when necessary. The precipitating agent also may be referred to as a "precipitant". Instead of or in addition to the second phase, the first phase may contain the precipitating agent. When the precipitating agent is contained in the first phase, the concentration thereof is not particularly limited, and may be the same as that when the precipitating agent is contained in the second phase, for example. Furthermore, for example, the first phase containing the precipitating agent may be brought into contact with the second phase (a gel or the like), thereby causing the second phase to be impregnated with the precipitating agent. The time period for which the first phase and the second phase are in contact with each other for this purpose is not particularly limited, and is, for example, 0 to 240 h, preferably 0 to 72 h, and more preferably 0 to 24 h. For example, the bubble collision step may be performed after allowing the first phase and the second phase to be in contact with each other until the concentrations of the precipitating agent in these phases reach equilibrium.

Crystallization (crystal precipitation) of a target substance (e.g., a protein, a nucleic acid, or the like) can be controlled by controlling the amount-of-substance ratio between the target substance and the precipitating agent to be used, for example. By controlling this amount-of-substance ratio more precisely, it is also possible to obtain large single crystals with still higher quality, for example. In the present invention, for example, by bringing a gel (e.g., an agarose gel) having a net-like molecular structure into contact with a solution (e.g., the first phase) containing a precipitating agent to diffuse the precipitating agent into the gel, it is possible to provide a gradient of the precipitating agent concentration in the gel. This allows the amount-of-substance ratio between the target substance and the precipitating agent to be controlled easily in the second phase. In this case, it is more preferable that the diffusion speed of the precipitating agent is sufficiently slower than the crystal growth speed. This allows crystallization of the target substance such as a protein to be realized under conditions where the mixing ratio is optimal, so that crystals can be produced still more easily. Thus, the production method according to the present invention is applicable to a crystallization screening method as a "combinatorial crystallization technique" that enables a simultaneous search for mixing ratios of various combinations.

The first phase and the second phase as described above are brought into close proximity (the "phase approximation step"). As described above, this phase approximation step preferably is the step of bringing the first phase and the second phase into contact with each other to form an interface therebetween. This interface forming step may include, for example, the step of allowing the first phase and the second phase to stand for a while with these phases being in contact with each other, thereby causing the second phase (a gel or the like) to be impregnated with the target substance etc., as described above.

Next, bubbles are formed in the vicinity of the interface in the first phase, and the thus-formed bubbles are caused to collapse (the "bubble collapse step"). As described above, this bubble collapse step preferably is a bubble collision step of forming bubbles in the vicinity of the interface to allow the bubbles to collide against the interface. The method for forming and then collapsing bubbles (preferably by causing the bubbles to collide against the interface) is as described above in connection with the target substance transfer method according to the present invention, for example. More specifically, bubbles are formed in the vicinity of the second phase in the first phase (when the first phase and the second phase are in contact with each other to form an interface therebetween, in the vicinity of the interface) by laser beam irradiation, for example. The thus-formed bubbles are caused to collapse (preferably collide against the interface) by cavitation behavior, for example, as described above. When a laser beam is used, a femtosecond laser beam is particularly preferable, because the focal point, the size of bubbles, etc. can be controlled easily, or undesired heat or chemical reactions are less liable to be induced, for example. The total irradiation energy of the laser beam is not particularly limited, and may be as described above in connection with the target substance transfer method of the present invention, for example. The pulse width of the laser beam is not particularly limited, and is, for example, $10^{-15}$ to $10^{-6}$ seconds, preferably $10^{-15}$ to $10^{-9}$ seconds, and more preferably $10^{-15}$ to $10^{-12}$ seconds. The frequency of the laser beam is not particularly limited, and is, for example, 1 to $10^6$ Hz, preferably 1 to $10^4$ Hz, and more preferably 1 to $10^3$ Hz. The irradiation time of the laser beam is not particularly limited, and is, for example, 0.01 to $10^6$ seconds, preferably 0.1 to $10^5$ seconds, and more preferably 1 to $10^4$ seconds.

After the target substance has been transferred from the first phase to the second phase by the above-described target substance transfer step, crystals are precipitated in the second phase or at the interface (the "crystal precipitation step"). The method for precipitating crystals is not particularly limited. For example, precipitation may be achieved by allowing the second phase to stand until crystals are precipitated while keeping the first phase and the second phase in contact with each other or after the first phase has been removed. It is preferable that the second phase is allowed to stand without removing the first phase, from the viewpoints of the stability of the precipitated crystals, continuous supply of the target substance, etc. The temperature at which the second phase is allowed to stand is not particularly limited, and is, for example, 0° C. to 200° C., preferably 0° C. to 150° C., and more preferably 0° C. to 100° C. For example, the target substance (e.g., a protein) may be caused to permeate into the second phase (e.g., a gel) in the target substance transfer step, and the second phase in which the concentration of the target substance has been increased may be allowed to stand with the target substance being maintained therein.

According to the crystal production method of the present invention, for example, even in the case where it is difficult to crystallize the target substance by irradiating a single-phase system of a liquid phase (a solution, dispersion, suspension, or the like) or a solid phase (a gel or the like) containing a target substance with a laser beam, it is possible to crystallize the target substance to obtain crystals thereof. Thus, the crystal production method according to the present invention is particularly effective for production of crystals of a target substance that is difficult to crystallize (e.g., a biological substance such as a protein or a nucleic acid). The reason for this is unknown, but it is speculated that this is because, for example, the concentration of the target substance in the second phase can be increased more easily than by ordinary methods, as described above. Alternatively, it is speculated that this is because the shock caused by the collapse of the bubbles (preferably collision of the bubbles against the interface with the first phase) induces the crystal nucleus formation in the second phase or at the interface, thus promoting the crystallization. It is to be noted, however, that these mechanisms are merely based on speculation, and do not limit the present invention by any means.

In the case where the second phase is a solid phase (e.g., a gel), if crystals precipitated in the second phase or at the interface are covered with the second phase either entirely or partially, for example, the following advantage is obtained, although the mechanism thereof is unknown: crystals with high strength, quality, etc. can be obtained more easily, for example, as described above. Also, there is another advantage in that, because the crystals are covered with the gel, they are resistant to destruction, for example, as will be described below.

In at least one of the target substance transfer step and the crystal precipitation step, it is preferable to stir at least one of the first phase and the second phase. By doing so, it is possible to obtain, for example, crystals allowing higher resolution (more precise resolution) imaging and thus still more suitable for X-ray crystal structure analysis etc., although the mechanism thereof is unknown. This method is particularly effective for, e.g., target substances (e.g., proteins such as xylanase, AcrB, human lysozyme, and adenosine deaminase; and nucleic acids) that are less likely to yield crystals allowing high resolution imaging and suitable for X-ray crystal structure analysis etc. without performing the above stirring step. The resolution required to be applied to X-ray crystal structure analysis is, for example, 3.5 Å or less, preferably 3.0 Å or less, more preferably 2.6 Å or less, still more preferably 2.2 Å or less, and particularly preferably 1.8 Å or less. The lower limit of the resolution is not particularly limited, and is, for example, a value more than 0 Å. 1 Å is equal to $10^{-10}$ m (1/10 nm). The stirring speed is not particularly limited, and is, for example, 10 to 250 rpm, preferably 20 to 200 rpm, and more preferably 30 to 150 rpm. The stirring time is not particularly limited, and is, for example, 0.5 minutes to $1.0 \times 10^6$ minutes, more preferably 1.0 minutes to $1.0 \times 10^5$ minutes, and particularly preferably 1.0 minutes to $5.0 \times 10^4$ minutes. For example, according to conventional techniques where a protein or the like is crystallized in a gel, it is not possible to stir the gel itself, so that it may be difficult to obtain the above-described effect brought about by stirring. The crystal precipitation step in the present invention may be performed after removing the first phase or without removing the first phase, as described above. However, for example, when the crystal precipitation step is performed without removing the first phase and while stirring the first phase, it is also possible to obtain the above-described effect brought about by stirring.

The second phase may be a gel as described above, or may be a sol-state solution containing a gelling agent, for example. Even if the second phase is a sol-state solution, it may bring about effects of crystals being precipitated more easily and the formed crystals being resistant to damage etc., when it contains a gelling agent, although the mechanism thereof is not clear. The method for crystallizing the biological substance in the sol-state gelling agent solution is particularly beneficial when the gelling agent is a thermoreversible hydrogel, for example. Furthermore, for example, it is particularly preferable that the target substance (e.g., a biological substance such as a protein or a nucleic acid) is crystallized while stirring the sol-state solution containing the biological substance and the thermoreversible hydrogel, and thereafter, the solution is turned into a gel, in which crystals of the target substance are caused to grown further.

Crystals produced by the crystal production method according to the present invention preferably are crystals covered with the gel, for example. The conditions for producing these covered crystals are not particularly limited. For example, in the crystal production method of the present invention, crystals of the biological substance may be precipitated out of the gel, so that covered crystals covered with the gel are obtained as a matter of course. Although it is particularly preferable that the covered crystals are entirely covered with the gel, they may be covered with the gel only partially. In general, crystals of biological substances such as proteins are brittle and liable to be denatured by drying and the like. Thus, it is likely that crystals of biological substances are, e.g., damaged or denatured by physical shock or drying, unless an operation for applying them as samples for crystal structure analysis (mounting) and an operation for providing them as seed crystals (seeding) are carried out carefully and quickly, for example. In contrast, because the covered crystals are covered with a gel, they exhibit improved resistance to drying and physical shock, so that denaturation, damage, etc. of the crystals are less liable to occur. Thus, for example, the mounting operation and the seeding operation can be carried out much more easily. Moreover, the storage stability of the crystals also is improved.

It is preferable to remove the gel covering the covered crystal in advance, in the case where the gel may cause some disadvantage such as causing measurement noise in crystal structure analysis to be described below, for example. The method for removing the gel is not particularly limited. For example, when the gel is a thermoreversible hydrogel, the gel turns into a sol when it is cooled, so that it can be removed easily. The cooling temperature for turning the gel into a sol is not particularly limited. For example, in the case of Mebiol Gel, the cooling temperature is 15° C. or lower. Also, by processing the covered crystal by an appropriate method, it is possible to extract only the crystal free of the gel. The processing method is not particularly limited, and examples thereof include processing with the use of a laser beam. The laser beam also is not particularly limited, and it is particularly preferable to use a femtosecond laser beam. This is because the femtosecond laser beam allows processing to be performed only in the vicinity of the focal point, so that it brings about an advantage in that a crystal can be processed easily with a crystal production (growth) container being sealed, for example. Furthermore, by the processing using a laser beam, it is also possible to cut a crystal into a size and shape suitable for intended use such as structure analysis etc., for example. By cutting a crystal into a suitable size and shape according to such a processing step, it is also possible to produce a crystal having the suitable size and shape. Furthermore, for example, it is also possible to remove only the gel from the covered crystal appropriately by the processing step, thus producing a processed crystal having only a crystal portion. That is, the processed crystal may be a crystal covered with a gel, or may be a crystal not covered with a gel.

The above-described processing using a laser beam also can be carried out with respect to a crystal not covered with a gel. However, if the crystal is covered with a gel, it brings about the following advantages, for example, because it is immobilized and protected with the gel: the crystals can be processed easily and are less liable to be damaged; debris (chips and fragments of the crystal, etc.) produced during the processing does not diffuse and thus is less likely to reattached to a crystal surface.

By the crystal production method according to the present invention, for example, large crystals with high quality are more likely to be obtained than by conventional methods. Also, by the screening method utilizing the above-described concentration gradient formation (concentration gradient method), extensive search for crystallization conditions (combinatorial search) is possible. These methods can yield superior results to the vapor diffusion method, which has been used most commonly for crystallization of proteins and the like, for example.

According to the crystal production method of the present invention, for example, by precipitating crystals of the biological substance out of the second phase (e.g., gel) or the interface with the first phase, it is also possible to obtain the following advantages.

In structural analysis etc. of protein crystals in the field of structural genomics, a high level of skill is required for mounting of a crystal. For example, when crystal structure analysis is performed at low temperature, the following method has been used conventionally: a crystal placed under cryoprotective conditions is scooped together with a solution using a mounting instrument having a loop formed of a nylon thread, after which freezing and measurement are performed with the crystal being retained in the loop by surface tension. According to this method, the crystal is surrounded by the cryoprotectant solution, so that it is possible to retain the crystal in a noncontacting manner during the measurement. However, on the other hand, at the time of taking out the crystal, the crystal may suffer from physical damage by contact with the loop or the like. More specifically, because the crystals obtained in the solution move freely in the solution during the crystal mounting, they may be damaged before being subjected to X-ray measurement by indirect or direct contact with the loop or the like. Thus, in order to achieve measurement with high accuracy, an expert level of skill is required for handling the loop.

On the other hand, in the crystal production method according to the present invention, for example, crystals of the biological substance (a protein or the like) are precipitated out of the gel or the interface with the first phase (in particular, out of the gel), resulting in the state where the crystals of the biological substance are immobilized with the gel. Therefore, for example, owing to the facts that the crystals of the biological substance are immobilized with the gel and thus the movement thereof is restricted and that the crystals of the biological substance are protected with the gel and thus are resistant to damage, it becomes possible to carry out a mounting operation easily and thus with high repeatability. Accordingly, for example, by automating the crystal mounting step, it becomes possible to achieve full automation of X-ray structural analysis of protein crystals etc., which has not been possible to achieve previously. Also, because the crystals of the biological substance (a protein or the like) are precipitated out of the gel or the interface (in particular, out of the gel), the obtained crystals are covered with the gel. This allows freezing and an easily mounting operation of the crystals. Because the freezing can be achieved without deteriorating the quality of the crystals, it is possible to obtain highly accurate data.

Although the case where the second phase is a solid phase such as a gel has been described above basically with reference to illustrative examples in which the target substance is a biological substance such as a protein or a nucleic acid, the target substance may be any other substance, as described above.

Also, in the present invention, the second phase is not limited to a solid phase such as a gel, as described above. For example, the second phase may be a liquid phase. More specifically, for example, the target substance may be soluble in water, the first phase may be an aqueous phase, and the second phase may be an oil phase. Alternatively, the target substance may be insoluble in water, the first phase may be an oil phase, and the second phase may be an aqueous phase. Furthermore, for example, regardless of the kinds of the target substance and the first phase, the second phase may be an inactive liquid such as Fluorinert. Even if the second phase is a liquid phase to which it is generally difficult to transfer the target substance, according to the target substance transfer method of the present invention, it is possible to transfer the target substance to the second phase and to dissolve, suspend, or disperse the target substance in the second phase, as described above, for example. The crystal production method of the present invention in which the second phase is a liquid phase is particularly effective when the target substance is a low molecular weight organic compound, a high molecular weight functional organic compound, or the like, for example. This method can be used for producing crystals of a target substance such as a low molecular weight organic compound, a high molecular weight functional organic compound, or the like having pharmacological activity, and also for producing a drug or a pharmaceutical composition containing the target substance, for example. It is to be noted, however, that the target substance is not limited thereto, and may be any other substance. Specific examples of the target substance are as described above in connection with the target substance transfer method of the present invention.

<Composition Production Method>

The composition production method according to the present invention is, as described above, a method for producing a composition, including: a target substance transfer step of transferring a target substance, wherein the target substance transfer step is the step of transferring the target substance from a first phase to a second phase by the target substance transfer method according to the present invention, and the composition is a composition containing the target substance in the second phase. The composition production method according to the present invention is not particularly limited as long as it satisfies the above-described configuration.

A composition to be produced by the composition production method according to the present invention is not particularly limited, and examples thereof include a protein chip in which a protein is highly concentrated in a gel, as described above. Examples of the composition further include: analysis specimens to be used in analysis etc.; and circuits and integrated arrangements, such as organic functional devices. As described above, for example, even in the case where it is difficult to transfer the target substance to the second phase or to achieve a high concentration of the target substance in the second phase by ordinary methods, it is possible to achieve them by the target substance transfer method of the present invention. Utilizing this, the composition production method of the present invention can produce novel compositions that have been difficult to produce by conventional methods.

<Target Substance Transfer Device>

The target substance transfer device of the present invention is, as described above, a device for transferring a target substance from a first phase that is a liquid or solid phase containing the target substance to a second phase that is a liquid or solid phase, including: a phase approximation unit that brings the first phase and the second phase into close proximity; and a bubble collapse unit that forms a bubble in the vicinity of a boundary between the first phase and the second phase and then causes the bubble to collapse. The target substance transfer device according to the present invention is not particularly limited as long as it satisfies the above-described configuration.

FIG. 1 schematically shows an example of the target substance transfer device of the present invention. It is to be noted, however, that this is merely illustrative and does not limit the target substance transfer device of the present invention by any means. As shown in FIG. 1, this device includes a femtosecond laser 1, a green laser 2, a container 3, a lens 4, a beam splitter 5, dichroic mirrors 6 and 7, a shutter 8, an infrared cut filter 9, a photodetector 10, a function generator 11, a CCD camera 12, a stroboscopic light source 13, and an objective lens 14. A laser beam emitted from the femtosecond laser 1 can be split into two beams by the beam splitter 5. One of the thus-obtained two beams is reflected by the dichroic mirror 6, so that a sample in the container 3 can be irradiated with the reflected beam through the objective lens 14. The sample contains the first phase and the second phase, and a portion in the vicinity of the second phase in the first phase is irradiated with the laser beam. The other one of the two beams can be detected by the photodetector 10, and can be used to control the shutter 8 and the function generator 11. By opening and closing the shutter 8, it is possible to control the irradiation of the sample in the container 3 with the laser beam emitted from the femtosecond laser 1 (the pulse width, the irradiation time, etc.). The function generator 11 not only can serve as a generator that acts on the femtosecond laser 1 to provide a given waveform to a light beam emitted therefrom, but also can be used for controlling the CCD camera 12 and the stroboscopic light source 13, for example. Photographs of the sample in the container 3 can be taken by irradiating the sample with light emitted from the stroboscopic light source 13 and observing the light with the CCD camera 12 via the objective lens 14 and the infrared cut filter 9. The green laser 2 can be used for controlling the focal point of a laser beam emitted from the femtosecond laser 1, for example. A laser beam emitted from the green laser 2 passes through the lens 4, and then is reflected by the dichroic mirror 7, so that the sample in the container 3 can be irradiated with the laser beam through the objective lens 14. In the device shown in FIG. 1, the first phase and the second phase are brought into close proximity (preferably, they are brought into contact with each other to form an interface therebetween) in the container 3, for example. Thus, it can be said that the container 3 is the "phase approximation unit". The device of FIG. 1 does not include any special means for causing the formed bubbles to collide against the interface, and the formed bubbles collapse (preferably collide against the interface) by cavitation behavior. In this device, a portion in the vicinity of the second phase in the first phase is irradiated with the laser beam using the femtosecond laser 1, the beam splitter 5, the photodetector 10, the shutter 8, and the dichroic mirror 6, thereby forming bubbles and causing them to collapse (preferably collide against the interface with the second phase). Therefore, it can be said that, for example, the femtosecond laser 1, the beam splitter 5, the photodetector 10, the shutter 8, and the dichroic mirror 6 altogether serve as the "bubble collapse unit".

EXAMPLES

Next, examples of the present invention will be described together with reference examples. It is to be noted, however, that the present invention is by no means limited by the results and considerations of the results obtained in the following examples.

In the following examples and reference examples, laser beam irradiation was performed using a device having the configuration shown in FIG. 1. Used as the femtosecond laser 1 was an IFRIT-SA10 (trade name) manufactured by Cyber Laser. This laser had a fundamental wavelength of 780 nm, and it also could emit a laser beam with a wavelength of 260 nm by wavelength conversion. The pulse time width could be selected within the range from 200 to 2000 fs. In the following examples and reference examples, the frequency of a laser beam was 1 kHz, unless otherwise stated. The state of the focal point could be observed using a high-speed (CCD) camera 12 (HyperVision HPV-2 (trade name) manufactured by Shimadzu Corporation, or Photon MAX 512B (trade name) manufactured by Princeton Instruments) with a time resolution in the microsecond order of magnitude.

In the following examples and reference examples, used as a crystal production (growth) container (reference numeral 3 in FIG. 1) was a 96-well Imp@ct plate (trade name) manufactured by Greiner, unless otherwise stated. Unless otherwise stated, the nucleus formation ratio shown in each example or reference example is a valued obtained by dividing the number of wells in which crystal formation was observed by the total numbers of wells. Unless otherwise stated, "shot" or "shots" indicates the number of times laser beam irradiation was performed.

Figure 2:
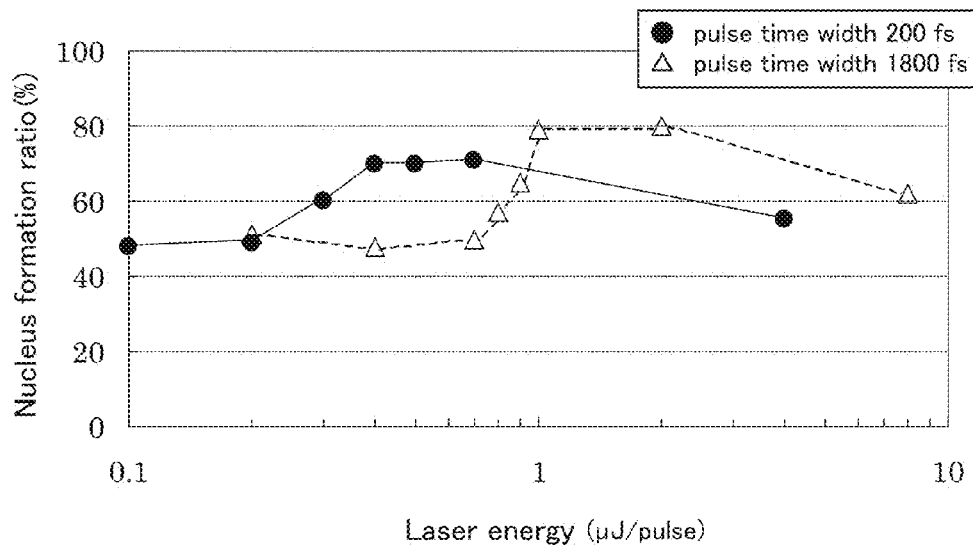
FIG. 2 is a graph illustrating the relationship between the nucleus formation ratio and the energy of a laser beam when a lysozyme solution single-phase system was irradiated with the laser beam.
Figure 3:
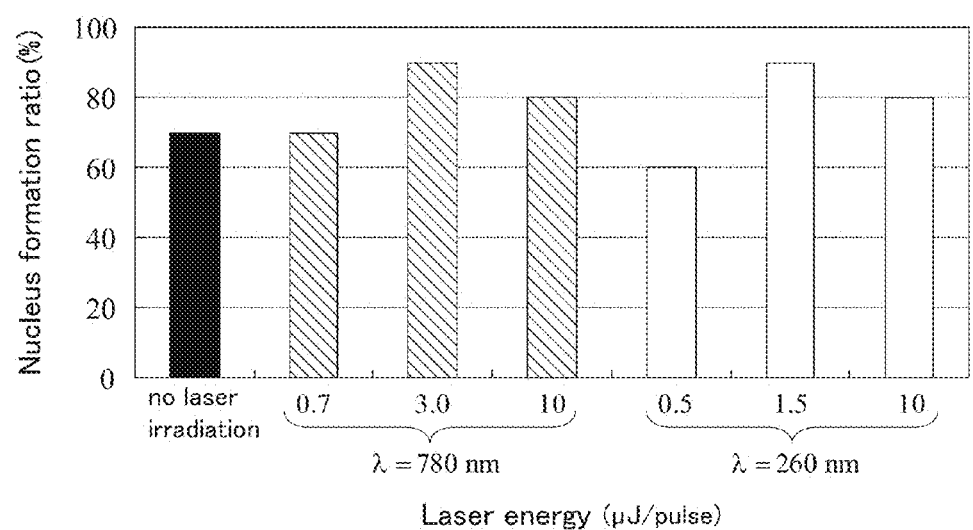
FIG. 3 is a graph illustrating the relationship between the nucleus formation ratio and the wavelength and energy of a laser beam, when the lysozyme solution single-phase system was irradiated with the laser beam.

Reference Example 1: Production of Lysozyme Crystals in Lysozyme Solution Single-Phase System Crystals were produced using a lysozyme solution single-phase system not containing a second phase. More specifically, first, to the crystal production (growth) container, 100 μL of a 40 mg/mL lysozyme aqueous solution (obtained by dissolving lysozyme and 3 wt % sodium chloride as a precipitating agent in an aqueous solution (pH 4.5) containing 0.1 M sodium acetate as a pH adjuster) was dispensed so that each well contained an equal amount of this solution. Two kinds of pulse time widths were used (200 fs or 1800 fs, each with a wavelength of 780 nm), and the nucleus formation ratio was examined while changing the total of the energies of the laser beam (laser energies) used for irradiation. As a result, as can be seen from the graph of FIG. 2, when the laser irradiation was performed in such a manner that the total of the energies thereof was not less than a certain energy threshold (200 fs: 0.7 μJ/pulse or 1800 fs: 1 μJ/pulse), the nucleus formation ratio was increased (nucleus formation was promoted) as compared to the case where laser beam irradiation was not performed. The threshold required for nucleus formation increased as the pulse time width became larger. Based on this, it is considered that nucleus formation is induced with the non-linear absorption caused by the femtosecond laser being a trigger (a factor). As can be seen from the graph of FIG. 3, even when the wavelength was changed to 260 nm, a threshold of the laser energy intensity was similarly observed for the occurrence of the promotion of nucleus formation. This threshold is slightly different from that shown in FIG. 2. This is because the numerical aperture (N.A.) of the objective lens used was different. Also, when the solution was irradiated with the laser beam having a wavelength of 260 nm, the laser beam exhibited high absorption efficiency, thus causing sediment, which is considered to a denatured protein, at the focal point. Such sediment was observed under the conditions where the promotion of nucleus formation did not occur. Thus, it is speculated that the denatured protein generated photochemically is not the main trigger (main factor) for nucleus formation in the present reference example.

Figure 4:
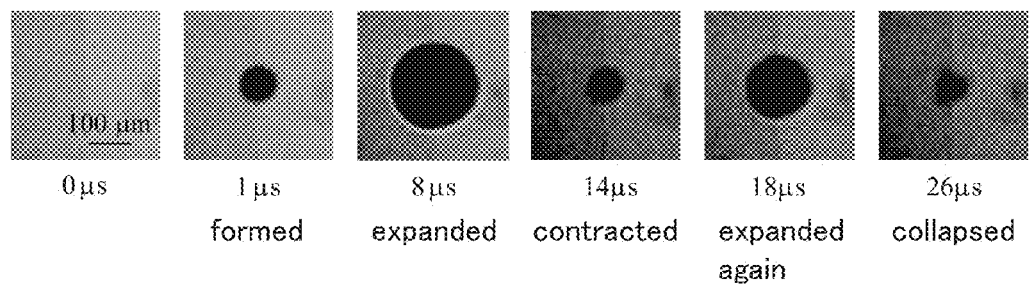
FIG. 4 shows photographs illustrating how a bubble changed with time when the lysozyme solution single-phase system was irradiated with a laser beam.
Figure 5:
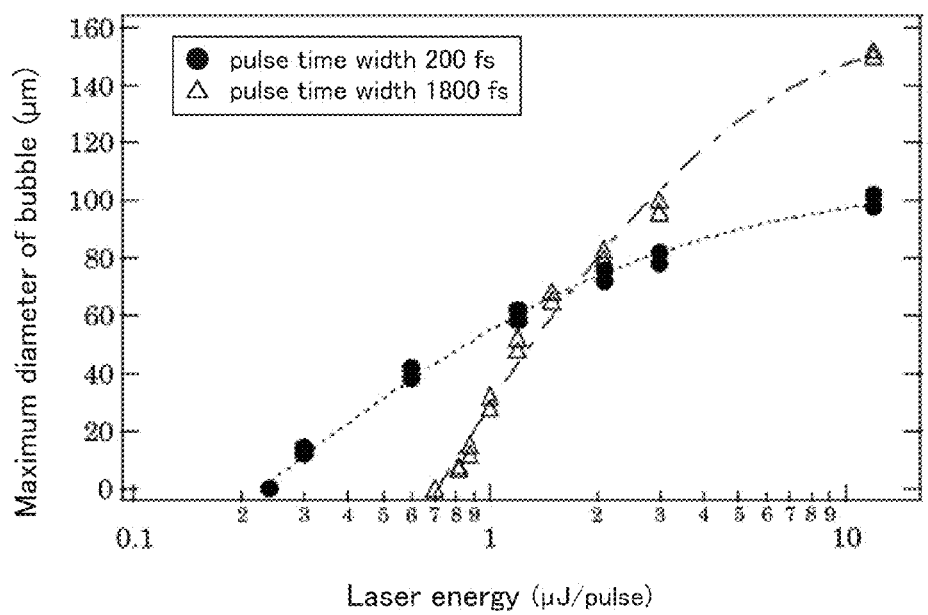
FIG. 5 is a graph illustrating the relationship between the maximum diameter of the bubble and the laser energy when the lysozyme solution single-phase system was irradiated with the laser beam.

Reference Example 2: Cavitation Behavior by Laser Beam Irradiation in Protein Solution The state of the lysozyme solution (aqueous solution) used in Reference Example 1 when irradiated with the laser beam was observed using the high-speed (CCD) camera. As a result, as can be seen from photographs of FIG. 4, cavitation behavior was observed, where bubbles were formed at the focal point within a few microseconds after the laser beam irradiation, the thus-formed bubbles collapsed in about some dozens of microseconds after repeated expansion and contraction, and thereafter, fine bubbles were left. Furthermore, using a submerged pressure sensor, it was confirmed that shock waves were generated at the time of the occurrence of this cavitation. Based on the dependency of the diameter of the bubbles on the laser beam intensity at this time, the thresholds (200 fs: 0.2 μJ/pulse, 1800 fs: 0.7 μJ/pulse) for the occurrence of cavitation (the formation of bubbles) were determined quantitatively as shown in the graph of FIG. 5, and it was confirmed that these thresholds are about the same as the thresholds for the lysozyme nucleus formation. Moreover, it was also confirmed that a maximum expansion and contraction speed (up to 60 μm/μs) in the cavitation estimated based on this observation result was higher than the free diffusion speed of the solute (lysozyme: up to 0.015 μm/μs) by three orders of magnitude. It is speculated that such high-speed expansion and contraction behavior leads to localized concentration fluctuation in the solution, which can serve as a trigger (factor) for nucleus formation.

Figures 6A, 6B:
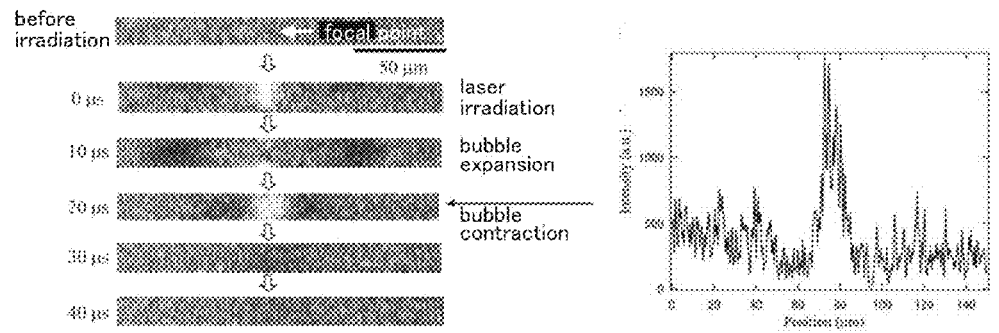
FIG. 6A shows photographs.
FIG. 6B is a graph.

Furthermore, using a solution of lysozyme labeled with a fluorescence molecule (tetra-methylrhodamine-5-isothiocyanate), an attempt was made to directly observe the concentration fluctuation around the cavitation. In the present experiment, a microscopic system equipped with a highly sensitive camera (used was an EMCCD, which is one type of highly sensitive CCD camera) was constructed to carry out high-speed fluorescence image observation in the solution. As a result, as can be seen from FIG. 6, during the contraction of the bubble, appearance of a region was observed in which the fluorescence intensity was about several times higher than those in surrounding regions. FIG. 6A shows photographs illustrating the time course of the high-speed fluorescence image observation, and FIG. 6B is a graph showing the fluorescence intensity distribution 20 μs after the laser irradiation. In FIG. 6B, the horizontal axis indicates the measurement position (μm), and the focal point was in the vicinity of 80 μm. The vertical axis indicates the fluorescence intensity. As can be seen from FIG. 6B, a particularly high fluorescence intensity was observed in the vicinity of the focal point.

Figure 7:
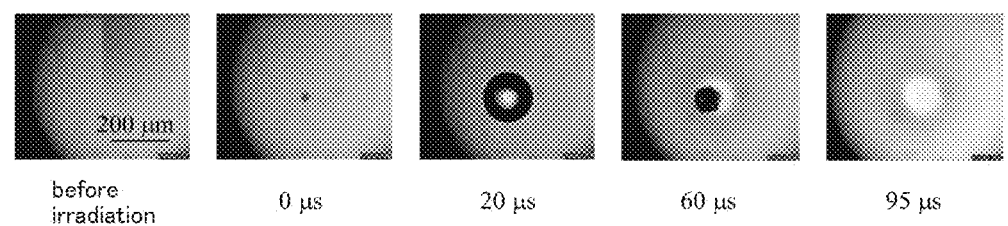
FIG. 7 shows an example of photographs showing the change in cytochrome C concentration with time around a bubble when a cytochrome C solution single-phase system was irradiated with a laser beam.

Furthermore, colored water-soluble protein cytochrome C was used instead of the lysozyme, and the concentration distribution in the solution was observed as the lightness distribution on an image. As a result, as can be seen from the photographs in FIG. 7, it was confirmed that the cytochrome C concentration distribution changed before and after the occurrence of cavitation, and low concentration regions were formed in the vicinity of the focal point while high concentration regions were formed around the low concentration region.

From the above results, it is speculated that, in the protein solution, owing to the expansion and contraction of the bubbles (cavitation), molecules around the bubbles are moved forcibly to form high protein concentration regions in a localized manner, resulting in the promotion of nucleus formation.

Examples of the method for crystallizing (producing crystals of) a protein utilizing light include: crystallization using, as a nucleus, a denatured protein produced by molecular arrangement owing to the action of optical electric-field or a denatured protein produced by ultraviolet absorption. In contrast to these methods, the method of the present reference example acts on the degree of supersaturation, which is an essential factor of nucleus formation. Thus, according to the principle of the present reference example, it can be inferred that nucleus formation can be induced not only in lysozyme but also in any protein or any target substance, regardless of the kind and physical properties thereof. If this principle is applied to a bi-phase system composed of the first phase and the second phase, the crystal production method according to the present invention can be carried out in a manner as in the examples to be described below, for example.

Figure 8:
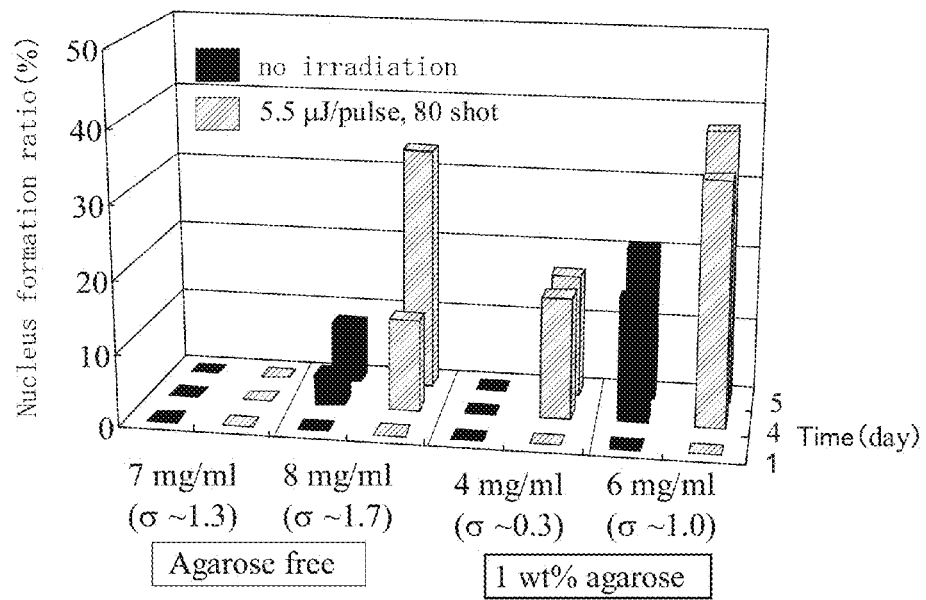
FIG. 8 is a graph showing one example of the nucleus formation ratio in a lysozyme solution single-phase system and a lysozyme-containing gel single-phase system.

Reference Example 3: Production of Protein Crystals by Laser Beam Irradiation in Gel In the present reference example, a gel was added to the same lysozyme solution (aqueous solution) as in Reference Example 1 to increase the viscosity of the solution, thus making an attempt to increase the nucleus formation rate by suppressing the molecule diffusion and thus extending the relaxation time of a high protein concentration region formed by cavitation. 1 wt % agarose was added as the gel, whereby the diffusion constant of lysozyme monomers was decreased to 50% to 80%. This gel-containing solution was irradiated with a femtosecond laser beam under the conditions of 5.5 µJ/pulse, 1 pulse, and 80 shot. Thereafter, the solution was allowed to stand for a predetermined period of time, and crystal (crystal nucleus) formation was examined by observation and the nucleus formation ratio (%) was calculated. Note here that the "80 shot" does not mean the number of times the irradiation was performed, but means 80 sites per well were irradiated. In the present reference example, the lysozyme concentration was varied, and to provide comparative data, the crystal production (nucleus formation) was carried out in the same manner with regard to the same lysozyme aqueous solution not containing the gel (agarose). The results are shown in the graph of FIG. 8. FIG. 8 is a graph three-dimensionally showing the correlation between the nucleus formation ratio and the respective conditions in the crystal production (nucleus formation) according to the present reference example. In FIG. 8, the axis in the depth direction indicates the time period for which the solution was allowed to stand after the laser irradiation (1 to 5 days), and the axis in the transverse direction in the plane of the drawing indicates the other respective conditions in parallel. "Agarose free" indicates no agarose was added, and "1 wt % agarose" indicates 1 wt % agarose was added. "7 mg/mL", "8 mg/mL", "4 mg/mL", and "6 mg/mL" each indicate the concentration of lysozyme. "σ" indicates the degree of supersaturation, which is represented by σ=((protein concentration)−(solubility))/(solubility). Each solution contained 8 wt % sodium chloride as a precipitating agent. As a solvent, an aqueous solution (pH 4.5) containing 0.1 M sodium acetate as a pH adjuster was used as in Reference Example 1. The axis in the longitudinal direction in the plane of the drawing indicates the nucleus formation ratio. As can be seen from FIG. 8, in the absence of the agarose, nucleus formation was not at all observed in the solutions with low degrees of supersaturation (σ≤1.3), regardless of whether or not the laser beam irradiation was performed. In contrast, in the presence of the agarose, crystal (crystal nucleus) formation was observed in the solutions with a low degree of supersaturation (σ=1.0), and the nucleus formation ratio was increased further by laser beam irradiation. In the case of the agarose-containing solution with a low degree of supersaturation (σ=0.3), crystal (crystal nucleus) formation was not observed in the absence of the laser beam irradiation, but nucleus formation was induced and crystals were produced by the laser beam irradiation. Also, regarding hardly crystallizable proteins such as an essential cell growth factor SAT and a membrane protein AcrB, by turning their solutions into gels and irradiating the gels with a laser beam, nucleus formation could be induced at a lower degree of supersaturation.

Figure 15:
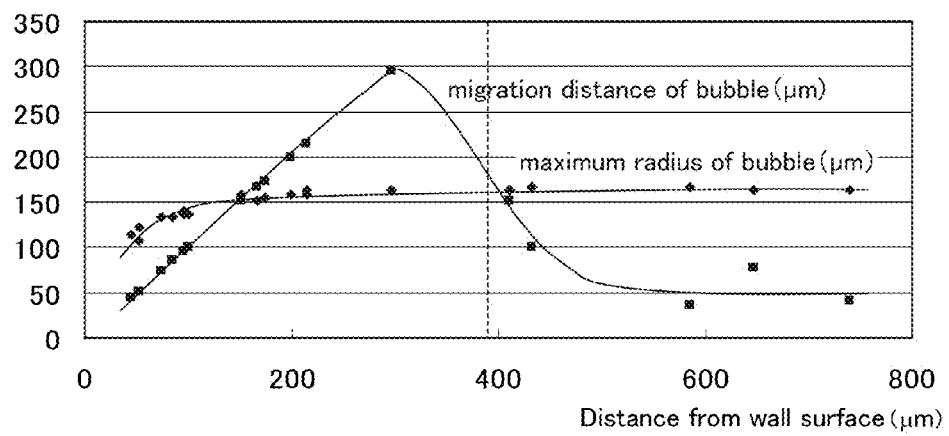
FIG. 15 is a graph illustrating the relationship between the distance from the focal point to an interface and the maximum radius and migration distance of a bubble, when the bubble is formed by focusing a laser beam.

Reference Example 4: Correlation Between the Distance from Interface and Cavitation Behavior The cavitation behavior when a laser beam was focused in ultrapure water in a glass cell was recorded with a high-speed camera (CCD camera). The photographs in FIG. 9 show the results thereof. As described in the "Mode for Carrying out the Invention" section above, the bubble formed at a position apart from the wall surface of the container (glass cell) disappeared without coming into contact with the wall surface (the upper row in FIG. 9). In contrast, the bubble formed by laser beam irradiation in the vicinity of the wall surface of the container was accelerated as if it was drawn to the wall and then disappeared by colliding against the wall (the lower row in FIG. 9). Also, the correlation between the distance from the focal point of the laser beam to the wall surface and the maximum radius and the migration distance of the bubble observed with the CCD camera was examined. The results thereof are shown in the graph of FIG. 15. In FIG. 15, the horizontal axis indicates the distance (µm) from the focal point of the laser beam to the wall surface. It can be estimated that the focal point of the laser beam was approximately the same as the point where the bubble was formed. The vertical axis indicates the maximum radius (µm) of the bubble or the migration distance (µm) of the bubble. In FIG. 15, a filled diamond (♦) indicates the correlation between the maximum radius of the bubble and the distance from the focal point of the laser beam to the wall surface. The filled square (■) indicates the correlation between the migration distance of the bubble and the distance from the focal point of laser beam to the wall surface. As can be seen from FIG. 15, when the laser irradiation position (the focal point) was close to the wall surface of the container (glass cell), the bubble moved greatly toward the wall surface and collapsed without contracting. The migration and collapse of the bubbles as described above were notable when the distance between the focal point and the wall surface was not more than twice the maximum radius of the bubble. In general, a bubble formed by laser beam irradiation collapses after expanding and contracting repeatedly, and as the irradiate energy of the laser beam increases, the frequency of the expansion and contraction is apt to increase and the maximum radius of the bubble is apt to be larger.

It was also confirmed that the cavitation was inhibited when the agarose was added to the solution of the present reference example to increase its viscosity. More specifically, with the irradiation energies of the laser beam being equal, the maximum radius of the bubble became smaller in keeping with the increase in the viscosity, and the collapse of the bubble was suppressed at the agarose concentration of 0.5 wt % or more.

Furthermore, under the same experimental conditions where the lysozyme solution single-phase system (no gel) was used as in Reference Examples 1 and 2, it was examined how the focal point of the laser beam and the radius of the bubble correlated with cavitation behavior and nucleus formation. As a result, under the condition where the bubbles collapsed without contracting (that is, the bubbles were very close to the wall surface of the container), the nucleus formation inducing efficiency was decreased even if the irradiation energy of the laser beam was the same. Furthermore, the dependency of the nucleus formation ratio on the radius of the bubble was examined with the laser beam irradiation position (the focal point) being fixed at a distance of 300 μm from the wall surface of the container. As a result, the nucleus formation inducing efficiency reached its maximum when the radius of the bubble was in the range from about 50 to about 100 μm, in which the migration of the bubble and the collision of the bubble against the wall surface did not occur. Therefore, it is considered that collapse of the bubbles by colliding against the wall surface of the container suppresses the formation of a high concentration region of the target substance to be crystallized. This result suggests that the size of a crystal growth container and the volume of a solution each can be a factor that determines the laser energy suitable for nucleus formation.

In the protein solution single-phase system according to the present reference example, when the migration of the bubbles and the collision of the bubbles against the wall surface were caused by focusing the laser beam in the vicinity of the wall surface of the container, the nucleus formation inducing efficiency was decreased. Based on this, it is inferred that, in the case of a bi-phase system composed of a solution and a gel, when a laser beam is focused in the vicinity of the interface with the gel in the solution, the nucleus formation (crystal production) efficiency would be decreased as compared to the case where a laser beam is focused on a position apart from the interface. However, contrary to this inference, the inventors of the present invention found out that the nucleus formation (crystal production) efficiency is improved by focusing a laser beam in the vicinity of the interface with the gel to cause formed bubbles to collide against the interface. The results demonstrating this finding are shown in the following examples.

Figure 11:
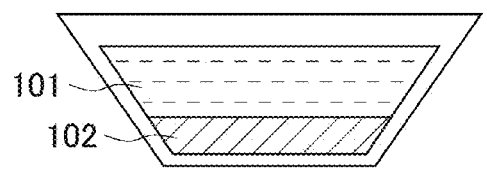
FIG. 11 is a sectional view schematically illustrating a bi-phase system composed of a liquid phase and a gel phase in a well.

Example 1: Production of Lysozyme Crystals in Bi-Phase System Composed of Solution and Gel Lysozyme crystals were produced in a bi-phase system composed of a lysozyme solution (the "first phase") and a gel (the "second phase"). Specifically, first, as shown in FIG. 11, a precipitating agent-containing gel 102 was placed so as to cover the bottom of each well of a crystal production (growth) container (Imp@ct plate). More specifically, an aqueous solution containing 0 to 4 wt % agarose SP (agarose Sea Plaque (trade name) manufactured by Takara Bio Inc.), 5 wt % NaCl as a precipitating agent, and 0.1 M NaAc (sodium acetate) as a pH adjuster was dispensed so that each well contained 3 to 4 μL of this aqueous solution. The solution was allowed to stand for at least 1 day, thereby turning the aqueous solution into a gel completely. As shown in FIG. 11, on the thus-obtained gel, a 13 mg/mL lysozyme aqueous solution 101 further was dispensed in an amount of 5 to 6 μL/well. The bi-phase system was allowed to stand for at least 3 days, thereby causing the lysozyme to permeate into the gel. It is considered that, during this process, the lysozyme concentration in the lysozyme aqueous solution (the first phase) 101 and the lysozyme concentration in the gel (the second phase) 102 reached equilibrium, although this was not confirmed.

Figure 12A:
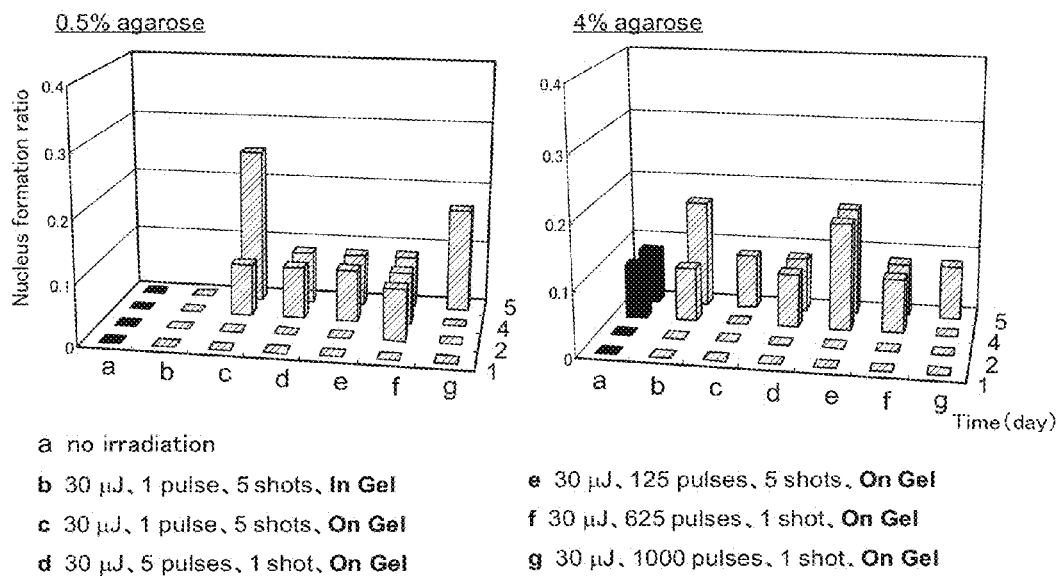
FIG. 12A shows graphs each showing the nucleus formation ratio in an example of the present invention.

These wells were exposed to laser beam irradiation using a femtosecond laser, and then were allowed to stand to precipitate crystals. The irradiation energy of the laser beam was set to 30 μJ/pulse, and the frequency was set to 1 kHz. The results are shown in FIG. 12A. The graphs of FIG. 12A each three-dimensionally show the correlation between the nucleus formation ratio and the respective conditions in the crystal production (nucleus formation) according to the present example. The left graph shows the results obtained when the agarose concentration in the gel (the second phase) was 0.5 wt %, and the right graph shows the results obtained when the agarose concentration in the gel (the second phase) was 4 wt %. In each graph, the axis in the depth direction indicates the time period for which the bi-phase system was allowed to stand after the laser irradiation (1 to 5 days), and the axis in the transverse direction in the plane of the drawing indicates the laser beam irradiation conditions a to g in parallel. "In Gel" indicates that the laser beam was focused in the gel, and "On Gel" indicates that the laser beam was focused in the vicinity of the interface with the gel in the solution. In the case of 5 shots (irradiation was performed five times), the time interval between the respective irradiations was set to 1 second. The axis in the longitudinal direction in the plane of the drawing indicates the nucleus formation ratio.

As can be seen from FIG. 12A, in the case where the agarose concentration was 0.5 wt %, crystal nucleus formation was not at all observed when the laser beam irradiation was not performed (a) and when the laser beam was focused in the gel (b), whereas the crystal nucleus formation occurred when the laser beam was focused in the vicinity of the interface with the gel in the solution (c to g). On the other hand, in the case where the agarose concentration was 4 wt %, the crystal nucleus formation occurred also when the laser beam irradiation was not performed (a) and when the laser beam was focused in the gel (b), and among the conditions (c to g) where the laser beam was focused in the vicinity of the interface with the gel in the solution, the highest nucleus formation ratio was observed under the condition e. Moreover, although not shown in the drawing, an attempt also was made to crystallize lysozyme under the same conditions as in the present example, except that the agarose was not used (that is, the lysozyme solution single-phase system was used). As a result, nucleus formation was not at all observed regardless of whether or not the laser beam irradiation was performed.

That is to say, as can be seen from FIG. 12A, it was demonstrated that, according to the present example (the laser beam was focused in the vicinity of the interface with the gel in the solution), a highly advantageous effect was obtained that the nucleus formation could be caused even under the conditions where nucleus formation (crystal production) was not at all caused by focusing a laser beam in a protein solution single-phase system or in a gel, although there were variations in the nucleus formation ratio. Reference Example 3 verified that nucleus formation could be induced for hardly crystallizable proteins such as an essential cell growth factor SAT and a membrane protein AcrB at a low degree of supersaturation by laser beam irradiation in the gel. However, the present example demonstrates that, according to the present invention, it is also possible to obtain a still higher nucleus formation (crystal production) effect.

Figure 12B:
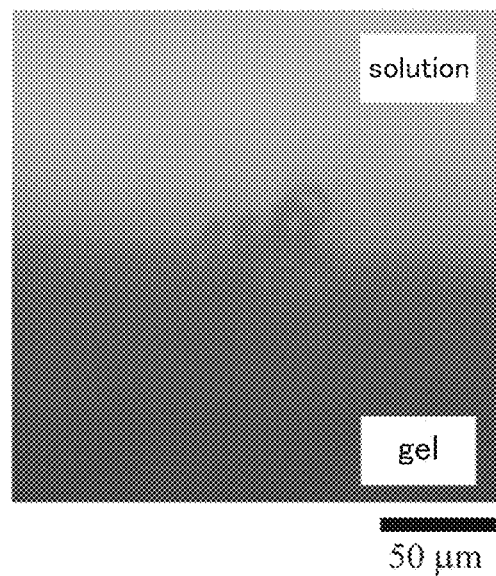
FIG. 12B is a photograph for observing the position of the precipitate lysozyme crystals in the example.

Furthermore, in order to observe the position of the precipitated lysozyme crystals, microscopic observation was carried out from the side (in the direction parallel to the solution-gel interface). As a result, as can be seen from FIG. 12B, at the laser irradiation position, crystal growth out of the gel toward the solution was observed. This clearly demonstrates that highly-concentrated protein molecules were introduced from the solution into the gel, thereby causing nucleus formation.

Figure 13:
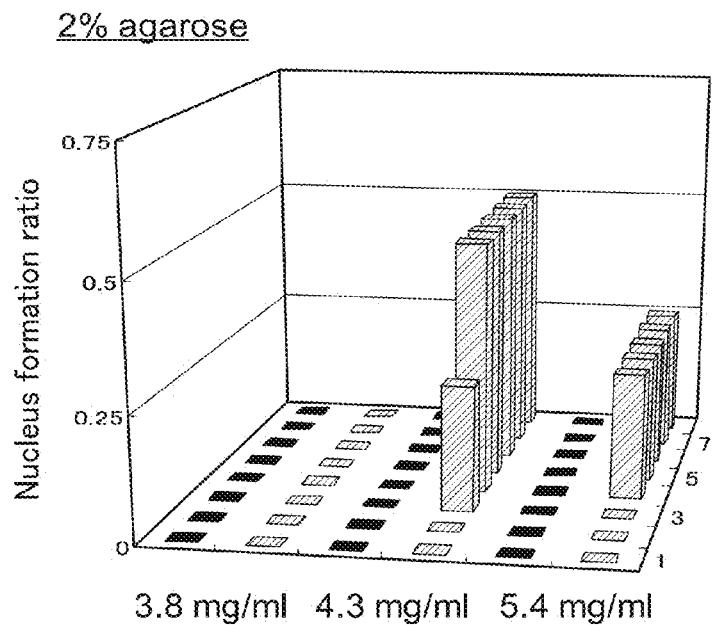
FIG. 13 is a graph showing the nucleus formation ratio in another example.

Example 2: Production of Glucose Isomerase Crystals in Bi-Phase System Composed of Solution and Gel Using glucose isomerase as a target substance to be crystallized instead of lysozyme, crystals were produced in the same manner as in Example 1. In the present example, the concentration of the agarose SP was set to 2 wt %, and the laser beam irradiation conditions were fixed to 30 µJ, 125 pulses, and 5 shots (the time interval between the respective irradiations was 1 second). The results are shown in FIG. 13. FIG. 13 is a graph three-dimensionally showing the correlation between the nucleus formation ratio and the respective conditions in the crystal production (nucleus formation) according to the present example. In FIG. 13, the axis in the depth direction indicates the time period for which the bi-phase system was allowed to stand after the laser irradiation (1 to 7 days), and the axis in the transverse direction in the plane of the drawing indicates the concentration of the glucose isomerase. At each concentration, bars on the left show the results obtained when the laser beam irradiation was not performed, and bars on the right show the results obtained when the laser beam irradiation was performed. The axis in the longitudinal direction in the plane of the drawing indicates the nucleus formation ratio. As can be seen from FIG. 13, nucleus formation was not at all observed when the laser beam irradiation was not performed. However, according to the present example, high nucleus formation ratios were observed when the glucose isomerase concentration was 4.3 mg/mL and 5.4 mg/mL. Moreover, although not shown in the drawing, nucleus formation was not at all observed when the laser beam was focused in the gel, or when the agarose was not used (i.e., the protein solution single-phase system) regardless of whether or not the laser beam irradiation was performed. That is, it was verified that, according to the present example, even under the conditions where it is very difficult to crystallize the target substance, crystallization (nucleus formation) of the target substance first may become feasible by using a bi-phase system composed of a solution and a gel and focusing a laser beam in the vicinity of the interface with the gel in the solution.

Example 3: Production of Membrane Protein AcrB Crystals in Bi-Phase System Composed of Solution and Gel Using a hardly crystallizable membrane protein AcrB as a target substance to be crystallized instead of lysozyme or glucose isomerase, crystals were produced in the same manner as in Examples 1 and 2.

Reference Example 3 verified that nucleus formation could be induced for hardly crystallizable proteins such as an essential cell growth factor SAT and a membrane protein AcrB at a low degree of supersaturation by laser beam irradiation in the gel. Example 1 exhibited a still higher nucleus formation (crystal production) effect than that obtained by the laser beam irradiation in the gel. Then, in the present example, a hardly crystallizable membrane protein AcrB was actually used to demonstrate that the present example can exhibit a still higher effect than that obtained by the laser beam irradiation in the gel.

Figure 14A:
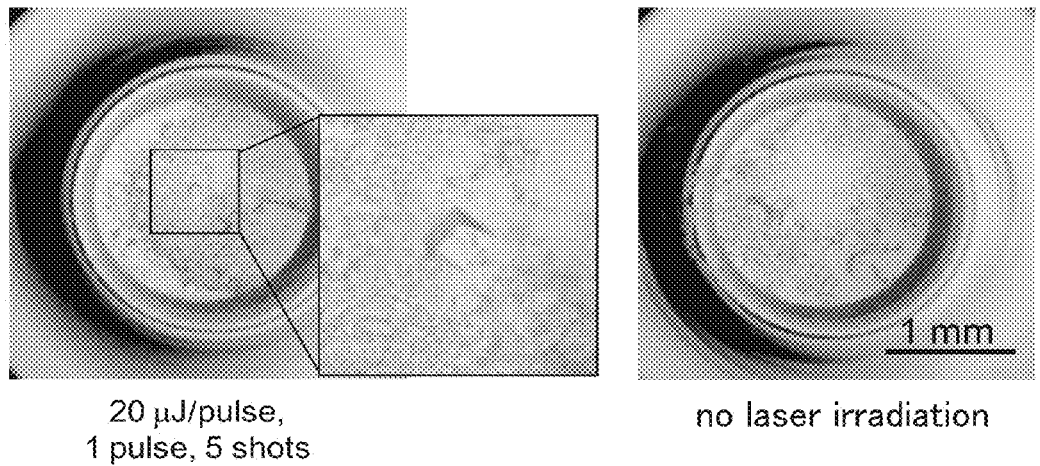
FIG. 14A shows photographs of protein crystals produced in still another example, together with a photograph showing the result obtained in a comparative example.

In the present example, in preparation of a protein solution (aqueous solution), the concentration of the protein (AcrB) was set to 28 mg/mL, the concentration of agarose SP was set to 0.5 wt %, and as a precipitating agent, a 18 wt % PEG 2000 (polyethylene glycol 2000) aqueous solution was used instead of NaCl. To each well, 4 µL of the gel, 2 µL of the AcrB aqueous solution, and 2 µL of the precipitating agent (the 18 wt % PEG 2000 aqueous solution) were dispensed. The first phase was a mixture of the AcrB aqueous solution and the PEG 2000. Thus, in the first phase, the AcrB concentration was 14 mg/mL and the PEG 2000 concentration was 9 wt %. The conditions for the laser beam irradiation were set to 20 µJ, 1 pulse, and 5 shots (the time interval between the respective irradiations was 1 second). Except for the above, crystal production was performed in the same manner as in Examples 1 and 2. The left two photographs in FIG. 14A show a crystal obtained in the present example. These photographs were taken after allowing the bi-phase system to stand for 3 days after the laser beam irradiation. As can be seen from FIG. 14A, according to the present example, a large AcrB single crystal with a well-defined crystal form was obtained. The right photograph in FIG. 14A was taken under the same conditions except that the laser beam irradiation was not performed. In this case, as can be seen from FIG. 14A, no crystal (crystal nucleus) was obtained.

Figure 14B:
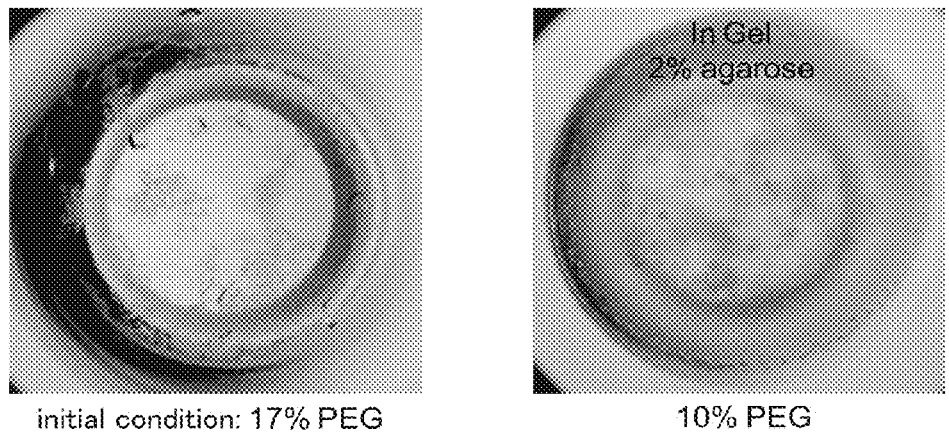
FIG. 14B shows a photograph of protein crystals produced in still another example, together with a photograph showing the result obtained in a comparative example.

Furthermore, FIG. 14B shows the result of comparison with the case where the laser beam was focused in the gel. The left photograph in FIG. 14B shows the result of the present example. It is to be noted that this photograph shows the result obtained when the agarose SP concentration was set to 6 wt % and the concentration of PEG 2000 (polyethylene glycol 2000) in the PEG 2000 aqueous solution was set to 17 wt %. As can be seen from FIG. 14B, in the present example, during the crystal precipitation (growth), sedimentation (turbidity) in the container disappeared, and crystals with high transparency and well-defined crystal plane were obtained. The right photograph in FIG. 14B shows the result obtained when the laser beam was focused in the gel. As can be seen from FIG. 14B, although crystals were obtained, they were inferior to the crystals of the present example in qualities such as the sharpness of the crystal form (planes) and the degree of transparency. It is to be noted that this photograph shows the result obtained under the conditions where the agarose SP concentration was 2 wt % and the concentration of PEG 2000 (polyethylene glycol 2000) in the PEG 2000 aqueous solution was 10 wt %, which are different from the conditions of the present example. This is because no crystallization (nucleus formation) occurred under the same conditions as in the present example.

As specifically described above, according to the present example, AcrB crystals with still more well-defined crystal planes and with higher transparency were obtained as compared to the case where the laser beam was focused in the gel. The crystal production method according to the present invention is not limited thereto, and may be applied to production of crystals of various kinds of proteins that are still more difficult to crystallize than SAT, AcrB, etc., for example.

Figure 16A:
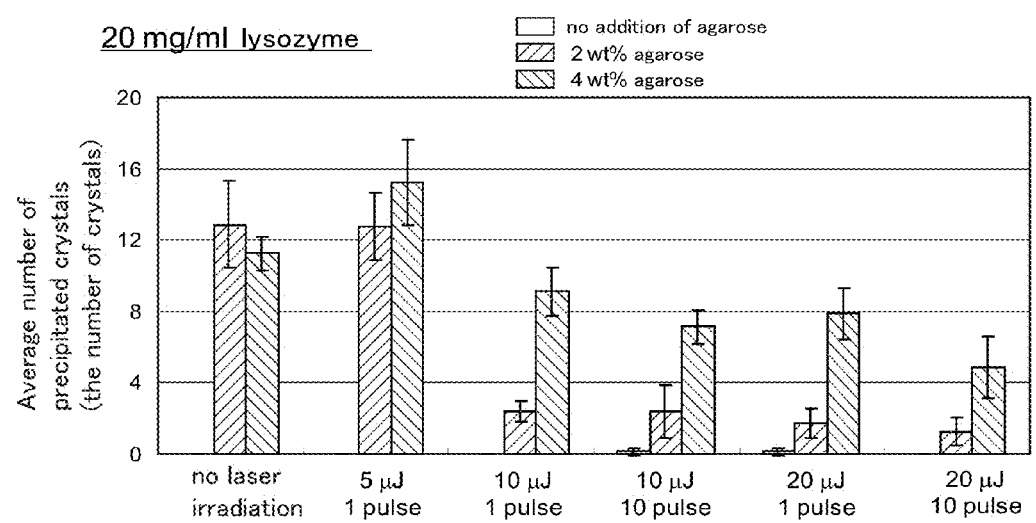
FIG. 16A is a graph illustrating the average number of precipitated crystals in still another example.
Figure 16B:
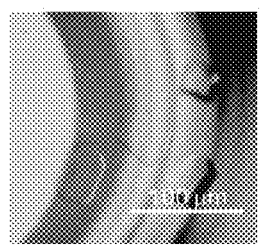
FIG. 16B is a photograph showing an example of crystals produced in the example of FIG. 16A.

Example 4: Production of Lysozyme Crystals in Bi-Phase System Composed of Highly Supersaturated Solution and Gel Lysozyme crystals were produced in the same manner as in Example 1, except that the lysozyme concentration was set to 20 mg/mL when preparing a lysozyme aqueous solution. In the present example, the gel and the aqueous solution were dispensed to each well (formation of an interface), and then, they were allowed to stand for 48 hours. Thereafter, they were exposed to laser beam irradiation, and then, they were allowed to stand for 1 day to precipitate crystals. The results are shown in the graph of FIG. 16A. In FIG. 16A, the horizontal axis indicates the laser beam irradiation conditions, and the vertical axis indicates the average number of precipitated crystals in each well. The number of times the laser beam irradiation was performed was set to 1 shot (1 time). Attempts were made to crystallize lysozyme under the respective irradiation conditions with the following various agarose concentrations: 2 wt %; 4 wt %; and no agarose (i.e., the lysozyme solution single-phase system and thus corresponding to a reference example). As can be seen from FIG. 16A, in the case where no agarose gel was used (the lysozyme solution single-phase system), nucleus formation did not occur at all when the laser beam irradiation was not performed, and even when the laser beam irradiation was not performed, the number of the formed crystal nuclei was very small. In contrast, when the agarose gel was used (the present example), under the irradiation conditions of 5 µJ and 1 pulse, the number of precipitated crystals was increased as compared with the case where the laser beam irradiation was not performed. Under the irradiation conditions with higher irradiation energies, as can be seen from FIG. 16A, the number of precipitated crystals was decreased, but larger crystals with higher quality were obtained, as compared with the case where the laser beam irradiation was not performed. The photograph of FIG. 16B shows an example of a crystal obtained in the present example. As can be seen from FIG. 16B, this crystal had a large maximum diameter of several tens µm, a well-defined crystal form (planes), and high transparency.

Example 5: Production (2) of Lysozyme and Glucose Isomerase Crystals

Figure 17:
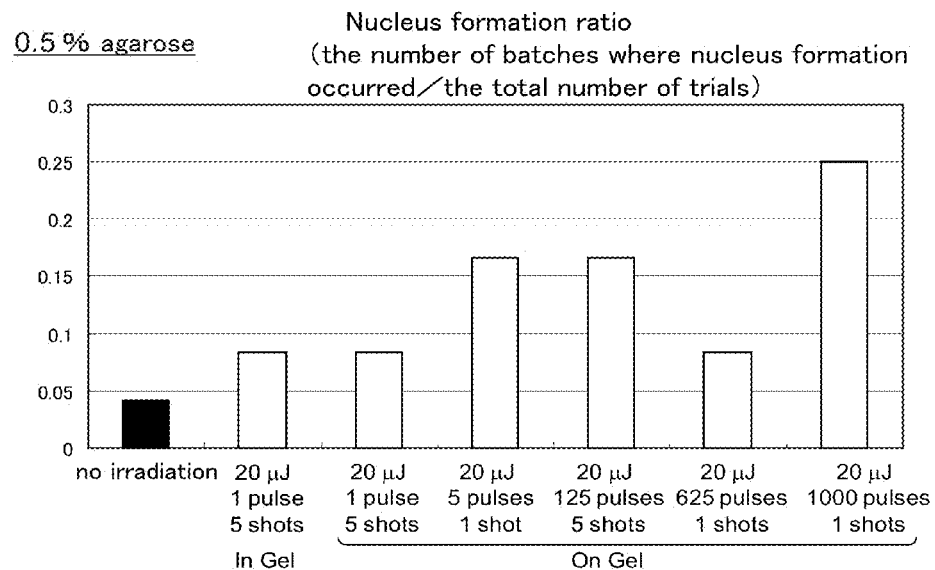
FIG. 17 is a graph showing the nucleus formation ratio in still another example.

Production of crystals (crystallization) of lysozyme was carried out in the same manner as in Example 1, except that the lysozyme concentration was set to 14 mg/mL when preparing a solution (the first phase) and that the laser beam irradiation intensity was set to 20 µJ/pulse. The results thereof are shown in the graph of FIG. 17. FIG. 17 shows the results obtained after allowing the bi-phase system to stand for 3 days after the laser beam irradiation. The horizontal axis indicates the laser beam irradiation conditions. As in Example 1, "In Gel" indicates that the laser beam was focused in the gel, and "On Gel" indicates that the laser beam was focused in the vicinity of the interface with the gel in the solution. The vertical axis indicates the nucleus formation ratio. As can be seen from FIG. 17, the laser beam irradiation improved the nucleus formation ratio.

Figure 18A:
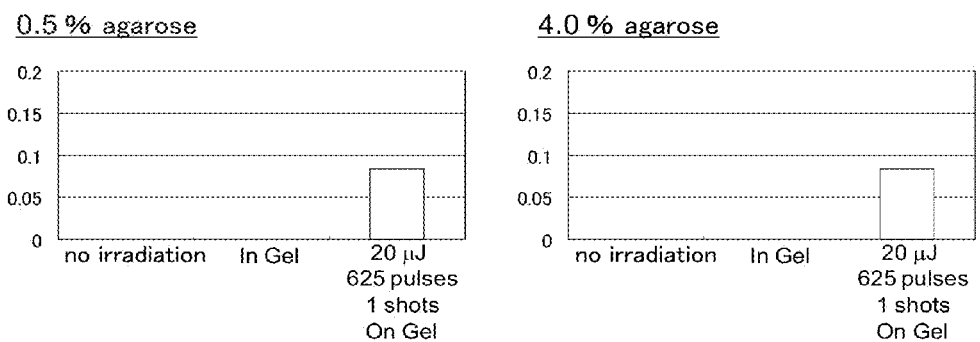
FIG. 18A shows graphs each showing the nucleus formation ratio in still another example.
Figure 18B:
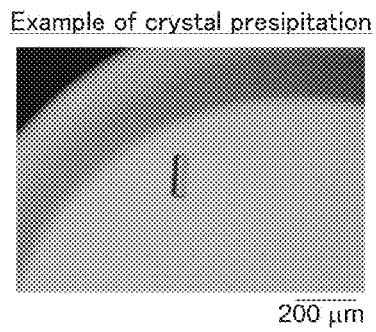
FIG. 18B is a photograph showing an example of crystals produced in the example of FIG. 18A.

Also, crystal production (crystallization) was carried out in the same manner as in the above, except that the lysozyme concentration when preparing the solution (the first phase) was changed from 14 mg/mL to 13 mg/mL, which is the same lysozyme concentration as in Example 1. The results thereof are shown in the graphs of FIG. 18A. It can be seen from the comparison between FIG. 18A and FIG. 17 that crystallization did not occur at all when no laser irradiation was performed and when the laser beam was focused in the gel, even though the concentration of the lysozyme was lowered only slightly. In contrast, when the laser beam was focused in the vicinity of the interface with the gel in the solution (the present example), crystals were obtained stably. As can be seen from the photograph of FIG. 18B, the crystal obtained in the present example shown in FIG. 18A had a large maximum diameter of a hundred and several tens µm, a well-defined crystal form (crystal planes), and high transparency, for example.

Figure 19:
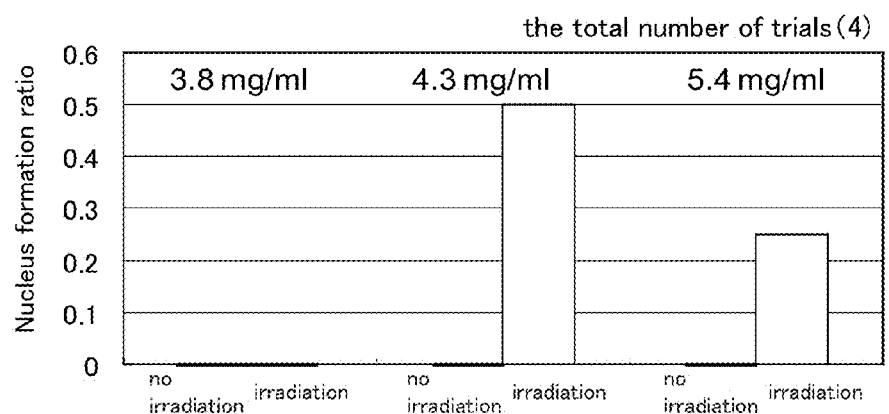
FIG. 19 is a graph showing the nucleus formation ratio in still another example.

Production of crystals (crystallization) of glucose isomerase was carried out in the same manner as in Example 2, except that the laser beam irradiation conditions were set to 20 µJ, 125 pulses, and 5 shots. The results thereof are shown in the graph of FIG. 19. FIG. 19 shows the result obtained after allowing the bi-phase system to stand for 4 days after the laser beam irradiation. As can be seen from FIG. 19, crystals were obtained while exhibiting favorable nucleus formation ratios as in Example 2. Moreover, crystal nucleus formation did not occur at all when the laser beam irradiation was not performed, and, also, when the laser beam was focused in the gel and when the gel was not used (a protein solution single-phase system), although the results of these two cases are not shown in the drawing.

Figure 20A:
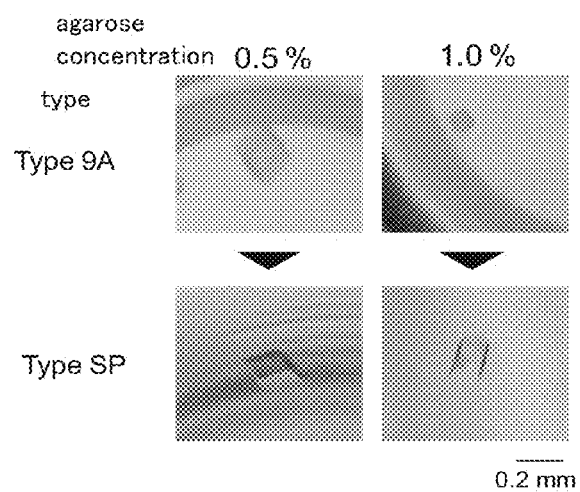
FIG. 20A shows photographs showing examples of crystals produced in a reference example.
Figure 20B:
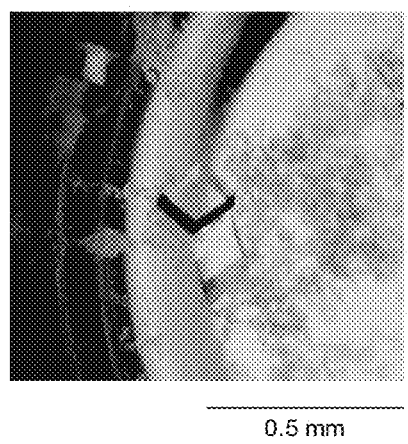
FIG. 20B is a photograph showing an example of crystals produced in another example.

Furthermore, it was confirmed here again that crystals with high quality can be obtained according to the crystal production method of the present invention. The results thereof are shown in FIGS. 20A and 20B. FIG. 20A shows photographs of crystals (correspond to a reference example) obtained by focusing a laser beam in a 0.5 wt % agarose 9A (trade name, manufactured by Takara Bio Inc.) or a 1.0 wt % agarose SP (trade name, manufactured by Takara Bio Inc.). Each gel contained 9.3 mg/mL AcrB as a protein and 6.5 wt % PEG 2000 as a precipitating agent. The laser beam irradiation conditions were set to 5.5 µJ, 1 pulse, and 20 shots (the time interval between the respective irradiations was 1 second), and the gel was allowed to stand for 2 days after the laser beam irradiation. FIG. 20B shows crystals produced according to an example of the present invention, in which, in a bi-phase system composed of a protein solution and a gel, a laser beam was focused in the vicinity of the interface with the gel in the solution. In this example, 0.5 wt % agarose SP was used to prepare the gel (the second phase). The protein aqueous solution (the first phase) was prepared by mixing an aqueous solution of 28 mg/mL AcrB and an aqueous solution of 20 wt % PEG 2000 as a precipitating agent in equal amounts in each well as in Example 3, thus preparing the first phase. The laser beam irradiation conditions were set to 20 µJ, 1 pulse, and 5 shots (the time interval between the respective irradiations was 1 second), and the bi-phase system was allowed to stand for 3 days after the laser beam irradiation. As can be seen from FIG. 20B, the crystal according to the example of the present invention (FIG. 20B) was much larger and had a well-defined crystal form (planes) and excellent transparency as compared to the crystals of the reference example (FIG. 20A).

Example 6: Transfer of Protein from Protein Solution to Fluorinert

Figure 21:
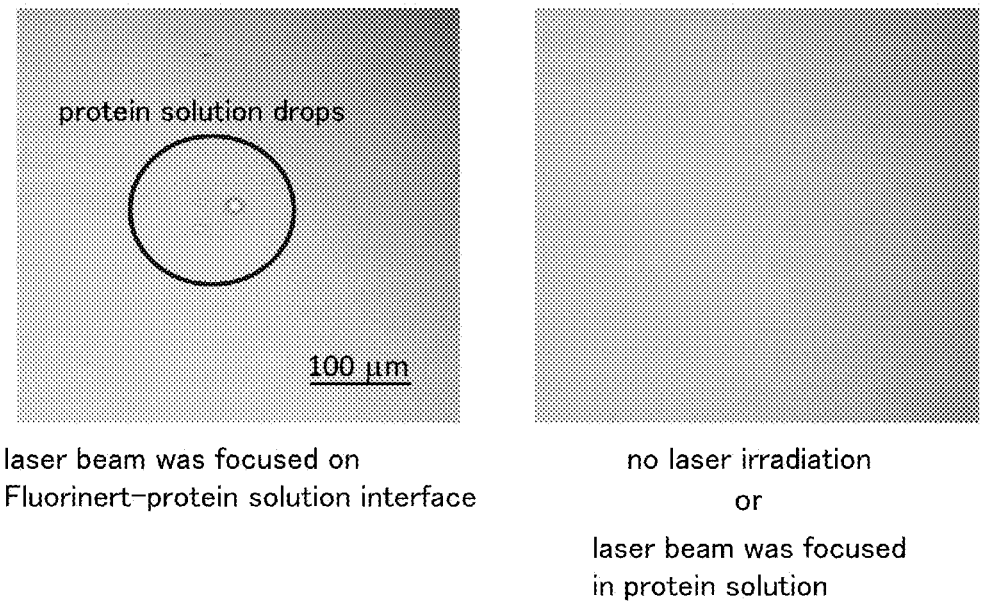
FIG. 21 show photographs demonstrating the transfer of a protein to Fluorinert (trade name) in still another example.

In the present example, a protein was transferred from a protein solution to Fluorinert. As a reaction vessel, a Nunclon DELTA Surface 96-well micro-batch plate was used. 100 µL of Fluorinert (a trade name of a fluorine compound commercially available from 3M Co.) was dispensed so that each well contained an equal amount of Fluorinert. On the Fluorinert, 100 µL of an aqueous solution containing 16 mg/mL lysozyme as a protein was further dispensed so that each well contained an equal amount of this solution. Thereafter, a laser beam was focused on the interface with the Fluorinert in the protein aqueous solution under the irradiation conditions of 30 µJ, 100 pulses, and 10 shots. The left photograph of FIG. 21 shows the Fluorinert immediately after the laser beam irradiation. As can be seen from FIG. 21, soon after the laser beam irradiation, the protein was transferred to the Fluorinert, so that protein drops (liquid droplets) were observed in the Fluorinert. These drops were left in the Fluorinert for at least 1 day, even when the protein aqueous solution was left on the Fluorinert instead of removing it. In contrast, when the laser beam irradiation was not performed or when the laser beam was focused on a position apart from the interface with the Fluorinert in the protein solution (the distance from the interface: 300 µm), transfer of the protein into the Fluorinert did not occur as shown in the right photograph of FIG. 21.

As described above, according to the present example, owing to cavitation behavior in the vicinity of the interface between first phase and second phase (collision of the bubbles against the interface), it was possible to transfer the protein to an inactive liquid to which it is difficult to transfer the protein by ordinary methods and to allow the protein to remain in the inactive liquid. Any target substance such as a low molecular weight organic compound or a high molecular weight functional organic compound may be used instead of the protein, for example. Also, an aqueous phase, an oil phase, or the like may be used instead of the inactive liquid.

Figure 24A:
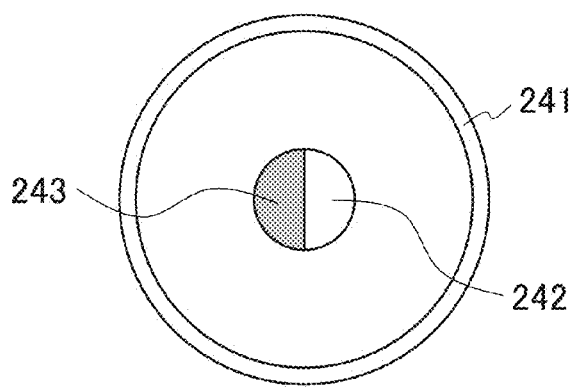
FIG. 24 schematically shows the arrangement of a gel on a well in still another example.
Figure 24B:
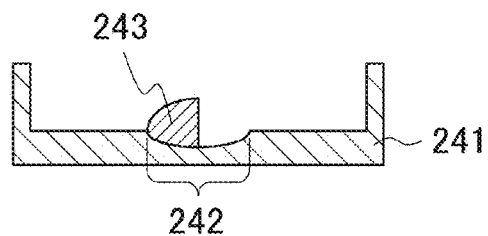
Figure 25A:
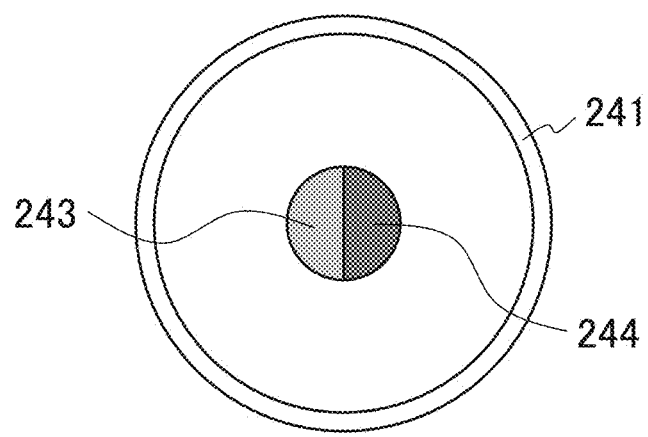
FIG. 25 schematically shows the state where a low molecular weight organic aqueous solution further was added to the well shown in FIG. 24.
Figure 25B:
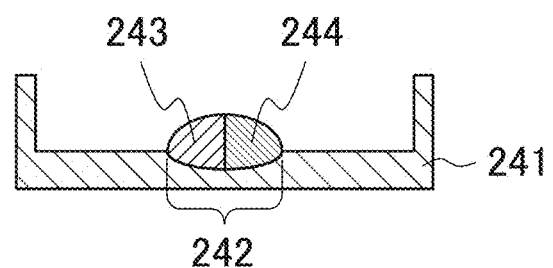
Figure 26A:
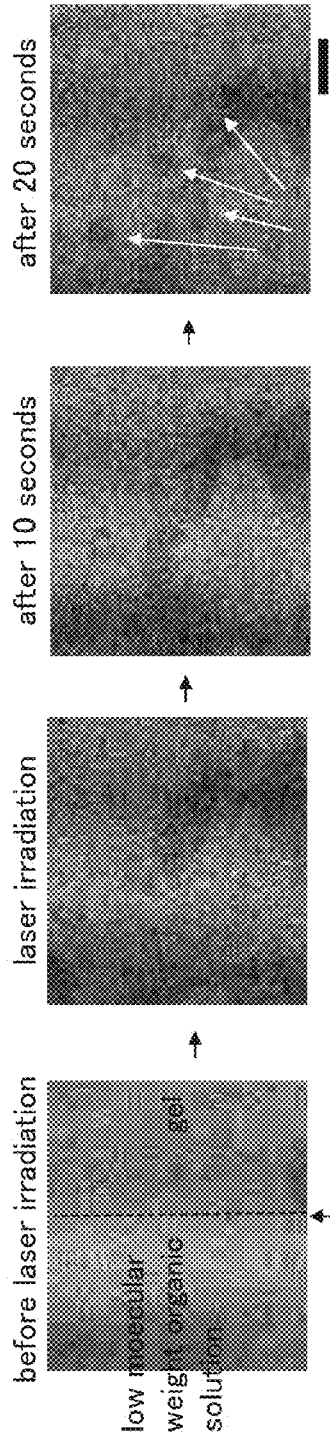
FIG. 26 shows photographs and schematic views illustrating crystal precipitation caused by laser beam irradiation in the example shown in FIGS. 24 and 25.
Figure 26B:
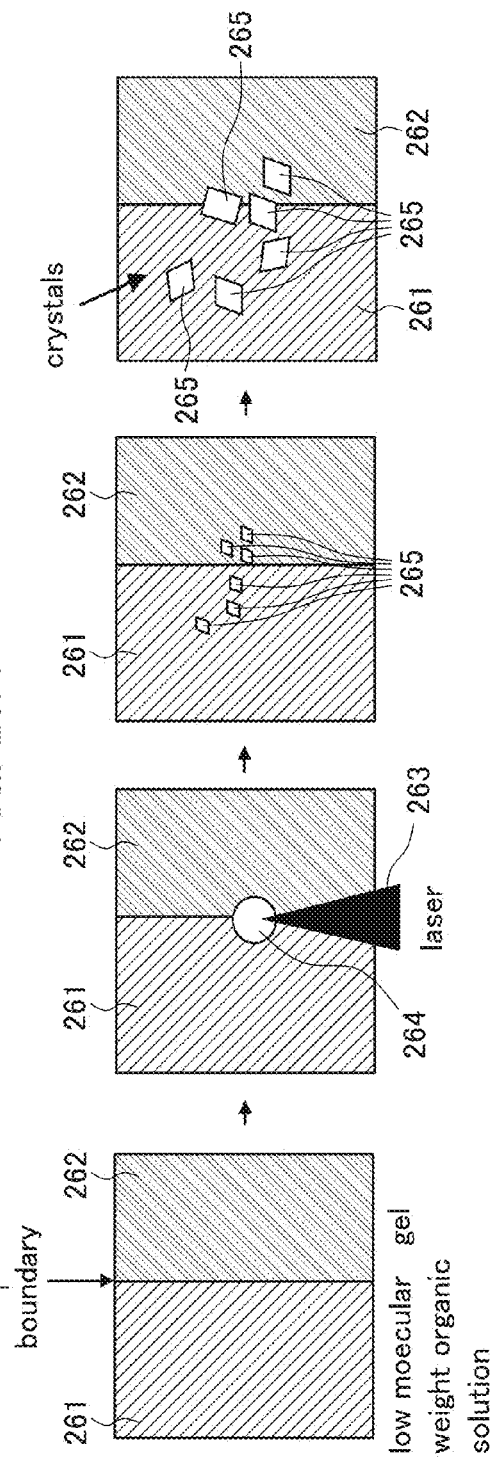

Example 7: Production of Crystals of Low Molecular Weight Organic Compound Paracetamol in Bi-Phase System Composed of Solution and Gel In the present example, as a target substance to be crystallized, paracetamol (also referred to as N-(4-hydroxyphenyl)acetamide or Acetaminophen), which is a low molecular weight organic compound, was used instead of a protein, and paracetamol crystals were produced in a bi-phase system composed of a paracetamol solution (the "first phase") and a gel (the "second phase"). Specifically, first, as shown in FIG. 24, a gel was arranged in a well of a crystal production (growth) container (a bottom dish manufactured by Matsunami Glass Ind., Ltd.) so as to fill a part of the well. As can be seen from FIG. 24, this crystal production (growth) container 241 was a round plate having a well 242 in its central portion. In the present example, as can be seen from FIG. 24, a gel 243 was arranged on the well 242 so as to occupy only the half of the well 242 on the left in the drawing. Specifically, first, an aqueous solution of 6 wt % agarose SP was solidified in a refrigerator, and then heated in a block incubator heated at 95° C. for 15 minutes to impart fluidity to the gel. 100 µL of the gel was added to the well 242 of the crystal production (growth) container, and the gel was solidified again. Thereafter, the gel on the well 242 was cut with a gel cutter so as to remove a part thereof, thus attaining the state shown in FIG. 24. Next, as shown in FIG. 25, to the part of the well 242 from which the gel had been removed by cutting (in FIG. 25, the right half of the well 242), 50 µL of a 40 mg/mL paracetamol (purity 98%, available from Acros) aqueous solution 244 was added. Before adding the paracetamol aqueous solution to the well, the paracetamol aqueous solution was heated at 70° C. in a block incubator for 1 hour to completely dissolve the paracetamol, and then was cooled to 60° C. After the addition, a laser beam emitted from a femtosecond laser (wavelength: 800 nm, pulse width: 182 fs, manufactured by Cyber Laser Inc.) was focused in the vicinity of the gel-solution interface in the paracetamol aqueous solution 244 at room temperature. The irradiation energy of the laser beam was set to 10 µJ/pulse, the frequency was set to 1 kHz, and the number of irradiation pulses was set to 125 pulse. Thereafter, the bi-phase system was allowed to stand to precipitate crystals. The results thereof are shown in FIG. 26. FIG. 26A (the upper row of FIG. 26) shows photographs (transmission images taken with the CCD camera) tracking the state of the laser beam irradiation and crystal precipitation over time. FIG. 26B (the lower row of FIG. 26) shows schematic views (schemes) showing the change with time in FIG. 26A. As can be seen from FIG. 26, in the vicinity of the boundary (interface) between a low molecular weight organic solution 261 (corresponding to the paracetamol aqueous solution 244 in FIG. 25) and a gel 262 (corresponding to the gel 243 in FIGS. 24 and 25), a laser beam 263 was focused on a focal point 264 on the low molecular weight organic solution 261 side. After the laser irradiation, the bi-phase system was allowed to stand for another 20 seconds, while being observed using the CCD camera every 10 seconds. As can be seen from FIG. 26A, it was observed that, in about 10 to 20 seconds after the laser irradiation, crystals 265 of paracetamol (a low molecular weight organic compound) were precipitated in the vicinity of the interface exposed to the laser irradiation. It was also observed that, at 20 seconds after the laser irradiation, the paracetamol crystals 265 grew and became larger as compared to those at 10 seconds after the laser irradiation.

Example 8: Visualization of Introducing Process of Protein into Gel in Bi-Phase System Composed of Solution and Gel In the present example, in order to visualize the process where a protein was introduced into a gel by cavitation, recording with a high-speed camera was performed in a bi-phase system composed of a lysozyme solution (the "first phase") stained with Coomassie Brilliant Blue (hereinafter referred to as "CBB") and a gel (the "second phase").

Figure 27:
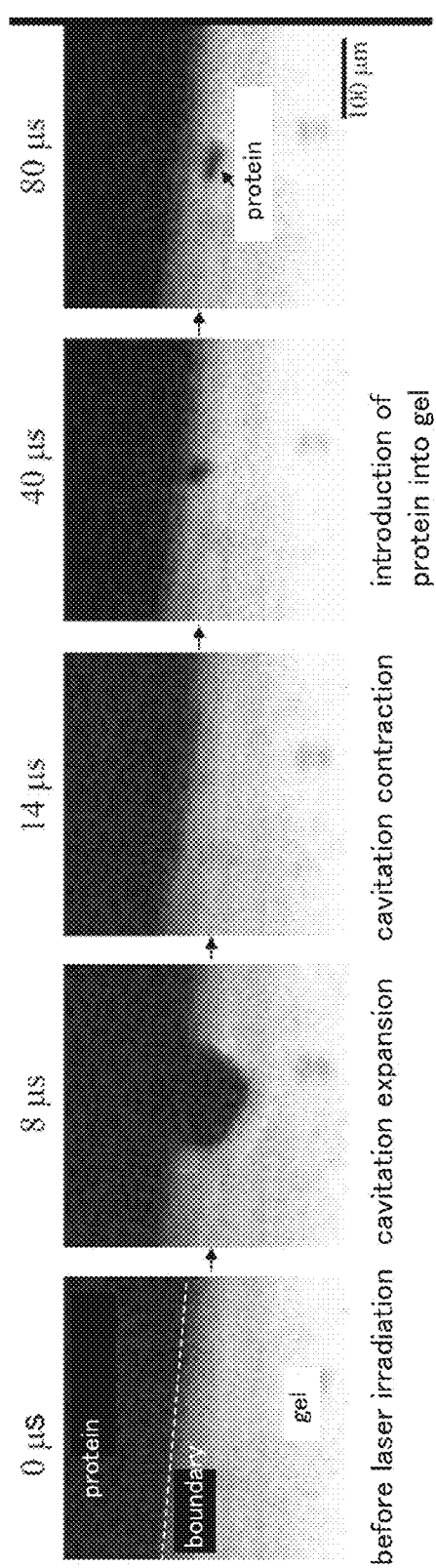
FIG. 27 shows photographs illustrating migration of a protein from a protein aqueous solution to a gel in still another example.

First, as a protein aqueous solution, an aqueous solution containing 0.0475 mg/mL Coomassie Brilliant Blue R-250 (Wako Pure Chemical Industries, Ltd.) and 20.2 mg/mL hen egg white lysozyme (recrystallized 6 times, Lot No. E40314, Seikagaku Corporation) was adjusted so as to contain 5 wt % NaCl and 0.1 M NaAc (pH 4.5), thus preparing 200 µL of a supersaturated aqueous solution. On the other hand, Agarose SP (Agarose Sea Plaque (trade name), Lot No. 0000215866, manufactured by Lonza) that had been adjusted at 6.0 wt % and stored at 4° C. was heated in an incubator at 95° C. for at least 15 minutes. The Agarose SP after being heated was adjusted so as to contain 1.0 wt % agarose, 5 wt % NaCl, and 0.1 M NaAc (pH 4.5). Self-made containers were provided by modifying cylindrical containers with a maximum capacity of 400 µL (manufactured by Nunc) so as to process their side surfaces to flat surfaces, and the thus-adjusted Agarose SP was dispensed so that each self-made container contained 45 µL of the Agarose SP. The self-made containers were centrifuged at 2500 rpm for 30 minutes using a plate centrifuge (PlateSpin (trade name), KUBOTA (KUBOTA CORPORATION)), and then allowed to stand still in an incubator at 4° C. for 24 hours. Thereafter, the self-made containers containing the gel were placed in an incubator at 20° C., and were further allowed to stand for at least 1 hour. On each gel, the supersaturated aqueous solution of the protein was added, and the bi-phase system was allowed to stand for 15 minutes. Thereafter, in the vicinity of the gel-solution interface on the gel side (in the gel), a femtosecond laser (the wavelength: 800 nm, the pulse time width: 182 fs, and the energy: 30 µJ/pulse) was focused via an objective lens (×10, OLYMPUS (Olympus Corporation)) to carry out single-pulse irradiation (the irradiation direction was parallel to the interface). Motion pictures were taken at 2 µs/frame. As a result, as shown in FIG. 27, during the cavitation behavior where bubbles were formed and then collapsed, the flow of the stained solution to the transparent gel was observed. This clearly demonstrates that the protein was introduced (transferred) into the gel. Also, another experiment was carried out in the same manner as in the above, except that the focal position of the laser beam was set in the vicinity of the gel-solution interface on the solution side (in the solution). As a result, as in the case of the photographs in the lower row of FIG. 9 (Reference Example 4), the bubble collapsed by colliding against the wall (the gel-solution interface in the present example). It was confirmed that the protein in the solution moved with the bubble at this time, and after the bubble collapsed by colliding against the gel-solution interface, the protein in the solution was transferred to the gel.

INDUSTRIAL APPLICABILITY

As specifically described above, according to the present invention, it is possible to provide a target substance transfer method, a crystal production method, a composition production method, and a target substance transfer device, which allow the concentration of a target substance to be increased easily and effectively. The present invention is applicable to, for example, crystallization of biological substances such as proteins and nucleic acids; low molecular weight organic compounds; high molecular weight functional organic compounds; etc., and production of compositions containing these substances at high concentrations. However, the use of the present invention is not limited thereto, and the present invention is applicable to a broad range of technical fields.

EXPLANATION OF REFERENCE NUMERALS

1: femtosecond laser
2: green laser
3: container
4: lens
5: beam splitter
6, 7: dichroic mirror
8: shutter
9: infrared cut filter
10: photodetector
11: function generator
12: CCD camera
13: stroboscopic light source
14: objective lens
101: first phase
102: second phase
103: target substance
104: laser beam
105: moving direction of bubbles
106: high concentration region of target substance
241: crystal production (growth) container
242: well
243: gel
244: paracetamol aqueous solution
261: low molecular weight organic solution
262: gel
263: laser beam
264: focal point
265: paracetamol (low molecular weight organic compound) crystal

The invention claimed is:

1. A method for transferring a target substance from a first phase to a second phase, the method comprising:
    a phase approximation step of bringing the first phase and the second phase into close proximity; and
    a bubble collapse step of forming a bubble in a vicinity of a boundary between the first phase and the second phase and then causing the bubble to collapse,
    wherein the first phase is a liquid phase and contains the target substance,
    the second phase is a liquid phase or a gel phase, and
    in the bubble collapse step, the bubble is formed by focusing a laser beam in the vicinity of the boundary between the first phase and the second phase, and thereby the target substance is transferred from the first phase to the second phase.

2. The method according to claim 1, wherein the target substance is an organic substance.

3. The method according to claim 2,
    wherein the organic substance is at least one material selected from the group consisting of proteins, which are native proteins or artificial proteins, peptides, which are native peptides or artificial peptides, nucleic acids, which are native nucleic acids or artificial nucleic acids, lipids, which are native lipids or artificial lipids, carbohydrate chains, which are native carbohydrate chains or artificial carbohydrate chains, high molecular weight organic compounds, low molecular weight organic compounds, and biological substances, which are high molecular weight biological compounds or low molecular weight biological compounds.

4. The method according to claim 1, wherein
    the phase approximation step is a step of bringing the first phase and the second phase into contact with each other to form an interface therebetween.

5. The method according to claim 4,
    wherein the bubble collapse step is a bubble collision step of forming the bubble in the vicinity of the interface to allow the bubble so as to collide the bubble against the interface.

6. The method according to claim 1,
    wherein a distance from a focal point of the laser beam to a surface of the second phase on the first phase side is not more than 4 times a maximum radius of the bubble.

7. The method according to claim 1, wherein
    a total irradiation energy of the laser beam is at least 60 nJ.

8. A method for producing a crystal, the method comprising:
    a target substance transfer step of transferring a target substance to be crystallized; and
    a crystal precipitation step,
    wherein the target substance transfer step is the step of transferring the target substance from the first phase containing the target substance to the second phase according to claim 1, and
    the crystal precipitation step is a step of, after the target substance transfer step, precipitating a crystal of the target substance inside the second phase or at an interface between the first phase and the second phase.

9. The production method according to claim 8,
    wherein in at least one of the target substance transfer step and the crystal precipitation step, at least one of the first phase and the second phase is stirred.

10. A method for producing a composition, the method comprising:
    a target substance transfer step of transferring a target substance,
    wherein the target substance transfer step is a step of transferring the target substance from the first phase to the second phase by the method according to claim 1, and
    the composition is a composition comprising the target substance in the second phase.

* * * * *